(12) United States Patent
Uraki

(10) Patent No.: US 8,411,084 B2
(45) Date of Patent: Apr. 2, 2013

(54) ANALYSIS MODEL GENERATION PROGRAM, ANALYSIS MODEL GENERATION APPARATUS, ANALYSIS MODEL GENERATING METHOD, AND METHOD FOR MANUFACTURING APPARATUS WITH ANALYSIS MODEL GENERATING METHOD

(75) Inventor: Yasushi Uraki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1067 days.

(21) Appl. No.: 11/987,573

(22) Filed: Nov. 30, 2007

(65) Prior Publication Data
US 2008/0165188 A1 Jul. 10, 2008

(30) Foreign Application Priority Data
Jan. 10, 2007 (JP) ................................. 2007-002907

(51) Int. Cl.
*G06T 17/00* (2006.01)
(52) U.S. Cl. ........ 345/420; 345/419; 345/423; 345/619; 411/348; 703/2
(58) Field of Classification Search .................. 345/419, 345/420, 423, 619; 411/348; 703/2
See application file for complete search history.

(56) References Cited

U.S. PATENT DOCUMENTS

| | | | |
|---|---|---|---|
| 7,079,990 B2 * | 7/2006 | Haller et al. ....................... 703/2 |
| 2001/0034590 A1 * | 10/2001 | Onodera et al. ................... 703/2 |
| 2001/0037686 A1 * | 11/2001 | Nihei et al. ....................... 73/799 |
| 2002/0130861 A1 | 9/2002 | Ujiie et al. |
| 2006/0024148 A1 * | 2/2006 | Wei ................................ 411/348 |
| 2007/0005314 A1 | 1/2007 | Ueda et al. |

FOREIGN PATENT DOCUMENTS

| | | |
|---|---|---|
| JP | 2001-265836 | 9/2001 |
| JP | 2002-279005 | 9/2002 |
| JP | 2006-91939 | 4/2006 |

OTHER PUBLICATIONS

Korean Office Action issued Aug. 27, 2009 in corresponding Korean Patent Application 10-2007-0130796.
Chinese Office Action issued Jun. 5, 2009 in corresponding Chinese Patent Application 200710302206.X.
European Office Action issued Feb. 24, 2009 in corresponding European Patent Application 07 121 922.4.

(Continued)

Primary Examiner — Kimbinh T Nguyen
(74) Attorney, Agent, or Firm — Staas & Halsey LLP

(57) ABSTRACT

A program stored in a storage medium directs a computer to perform the processes of: receiving a three-dimensional geometric model; referring to attribute information about fastening between the parts; extracting a fastening portion at which a first and second parts are fastened based on the attribute information and the three-dimensional geometric model; dividing each of the first and second parts into a first geometry in proximity of the fastening portion and one or more second geometries corresponding to a remaining portion in the three-dimensional geometric model; and with respect to each of the first geometries obtained by dividing the first and second parts respectively, referring to a parameter depending on the attribute information and a property value depending on a material of the part, calculating an equivalent property value reflecting fastening based on the parameter and the property value, and assigning the equivalent property value to the first geometry.

18 Claims, 19 Drawing Sheets

OTHER PUBLICATIONS

Joshua J. Radice, "The analysis and design of adhesively bonded composite structures", University of Delaware, Chapter IV, pp. 55-63, Fig. 4.1, 2005.

A.E. Bogdanovich et al., "Three-dimensional finite element analysis of double-lap composite adhesive bonded joint using submodeling approach", Composites: Part B: engineering, Elsevier Science LTD, vol. 30, No. 6, pp. 537-551, 1999.

K.Y. Lee et al., "A Small Feature Suppression/Unsuppression System for Preparing B-Rep Models for Analysis", ACM Symposium on Solid Modeling and Applications, 2005, pp. 113-124.

Extended European Search Report, mailed May 26, 2008 and issued in corresponding European Patent Application No. 07121922.4-2218.

* cited by examiner

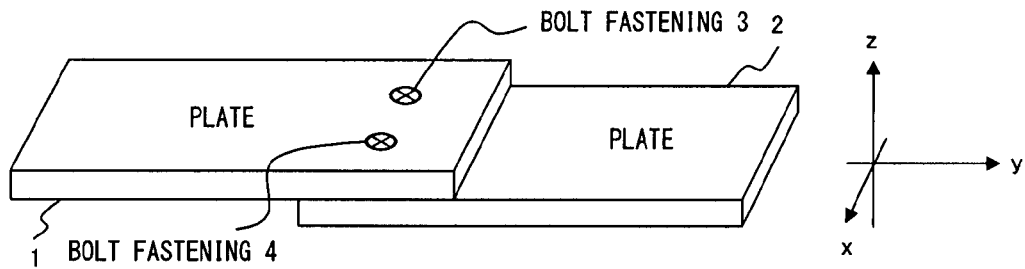
F I G. 2 A
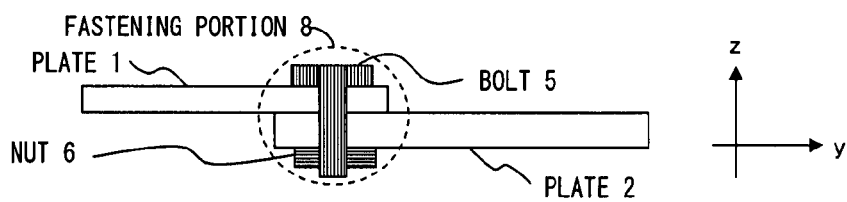
F I G. 2 B
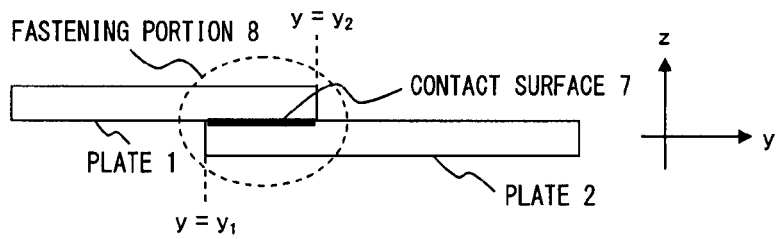
F I G. 2 C
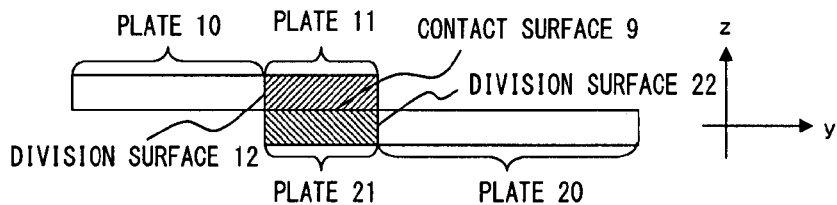
F I G. 2 D
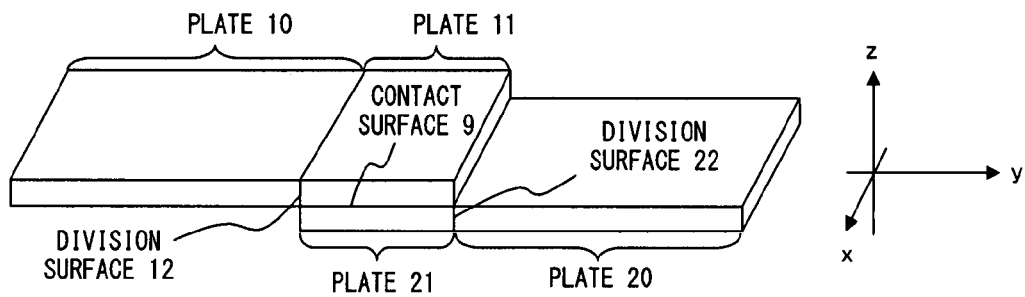
F I G. 2 E

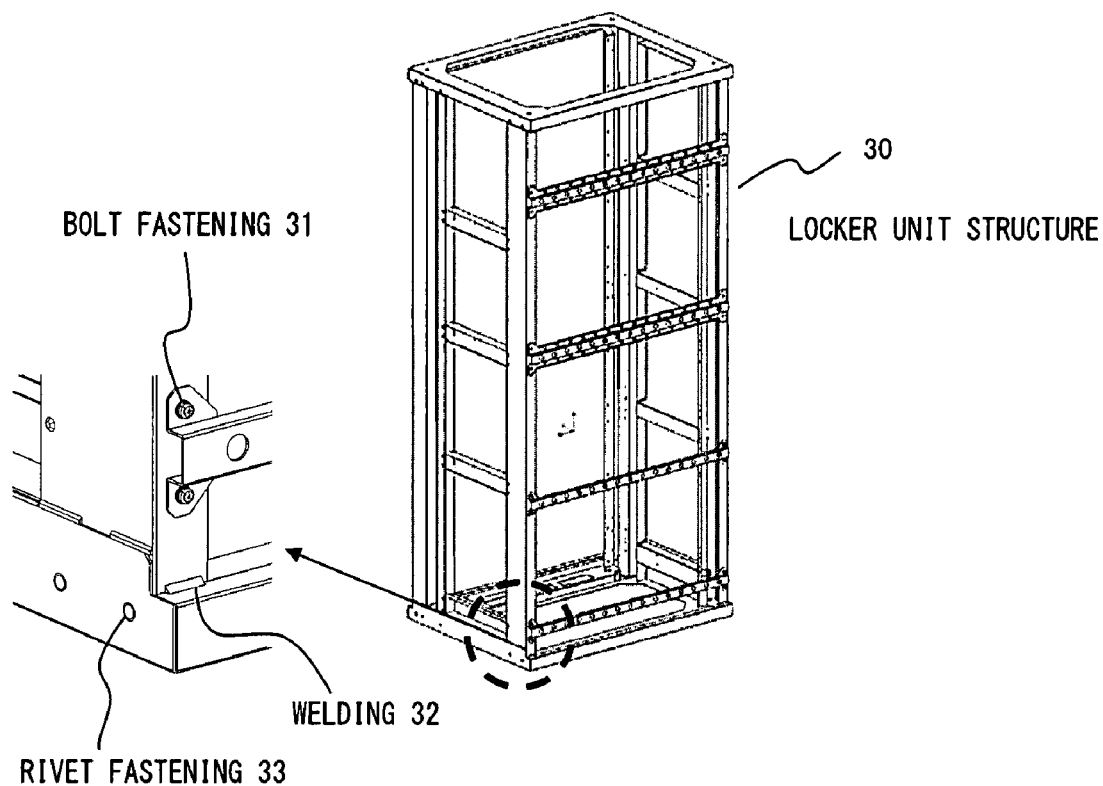
F I G. 3

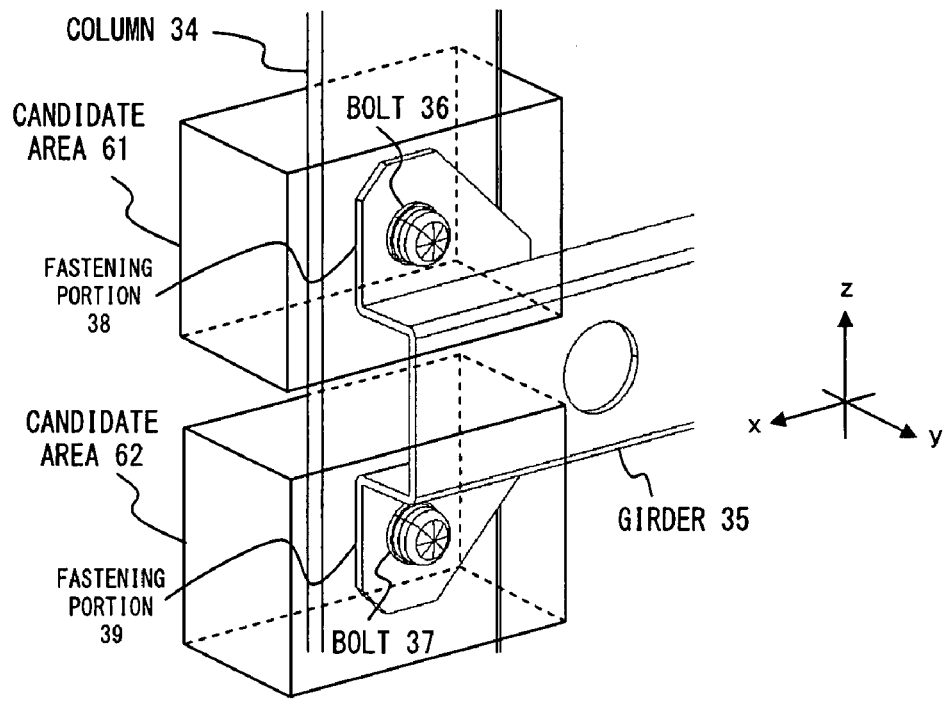
F I G. 7A
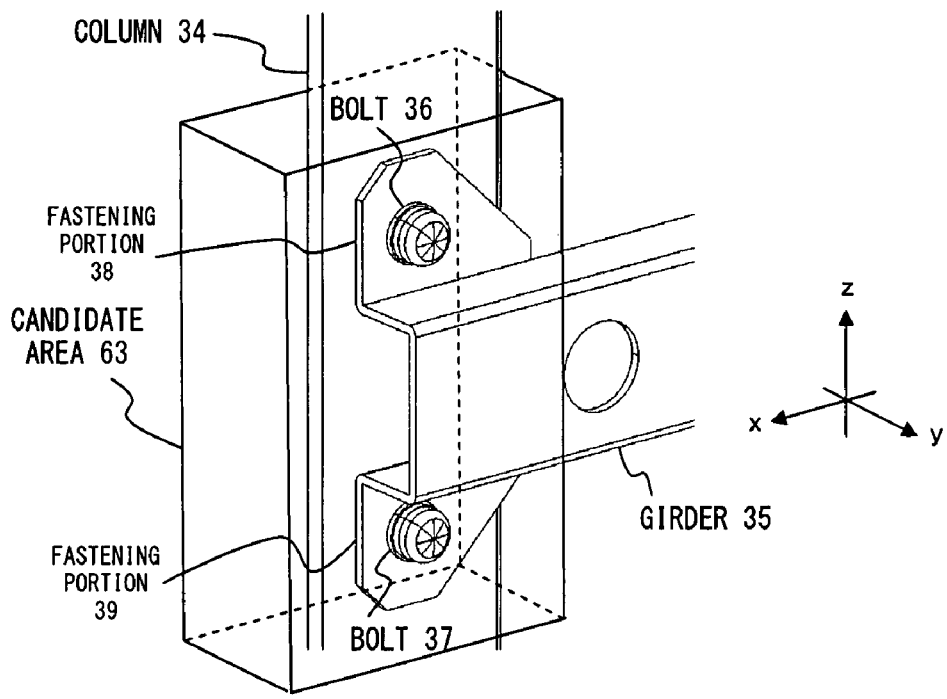
F I G. 7B

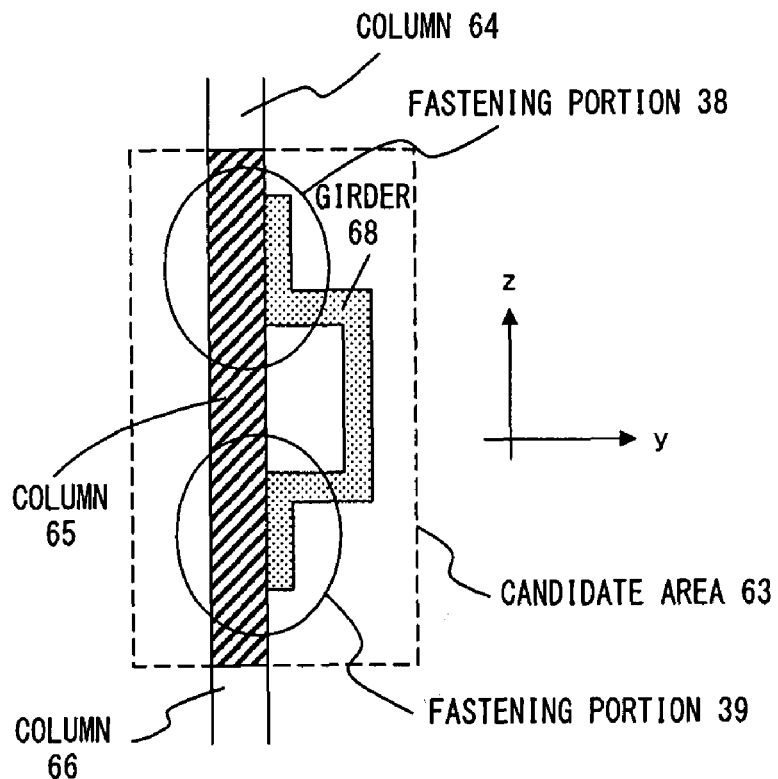
F I G. 8 A
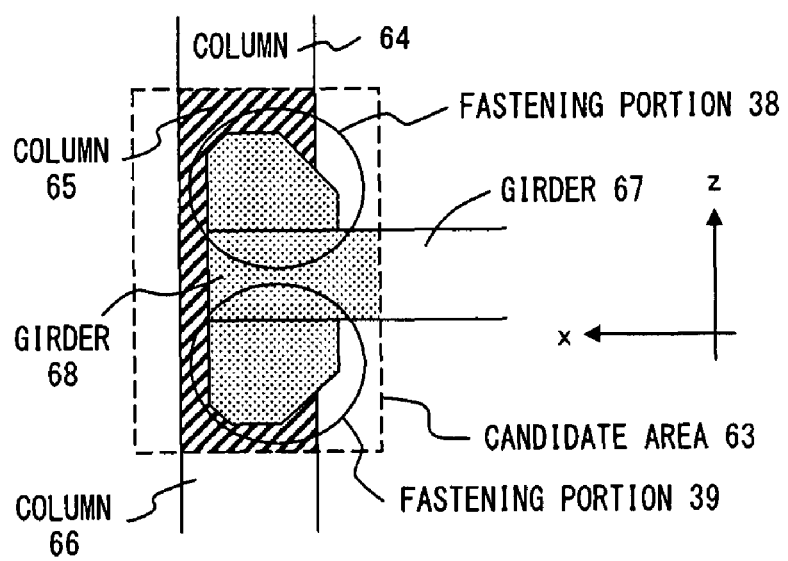
F I G. 8 B

|   | FASTENING TYPE | FASTENING COEFFICIENT |
|---|---|---|
| 1 | RIVET | 0.1 |
| 2 | BOLT | 0.3 |
| 3 | SPOT WELDING | 0.4 |

FIG. 10

| | DIAMETER | DIMENSION COEFFICIENT |
|---|---|---|
| 1 | LESS THAN φ3 | 1 |
| 2 | φ3~φ4 | 2 |
| 3 | φ4 OR MORE | 3 |

FIG. 11

|  | FILLET WELD | WELDING COEFFICIENT |
|---|---|---|
| 1 | PRESENT | 5 |
| 2 | ABSENT | 1 |

F I G. 1 2

| | MATERIAL | YOUNG'S MODULUS [GPa] | POISSON RATIO | MASS DENSITY [t/mm³] | THERMAL EXPANSION COEFFICIENT [1/K] |
|---|---|---|---|---|---|
| 1 | ALUMINUM | 71 | 0.3 | $2.68 \times 10^{-9}$ | $2.38 \times 10^{-5}$ |
| 2 | STEEL | 200 | 0.3 | $7.9 \times 10^{-9}$ | $1.73 \times 10^{-5}$ |

FIG. 14

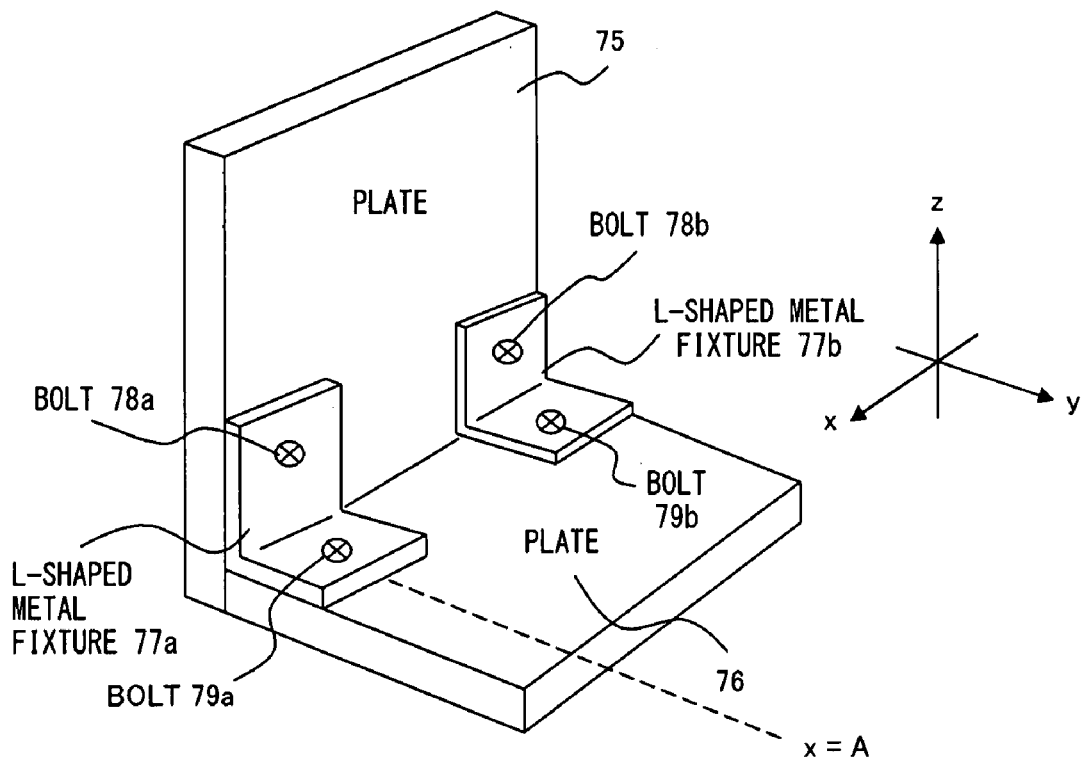
F I G. 16A
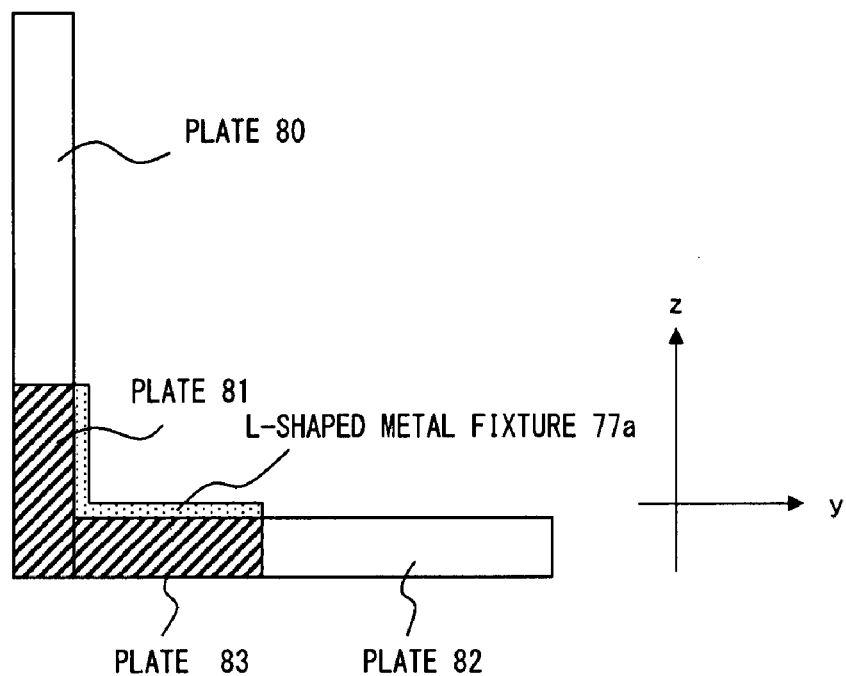
F I G. 16B

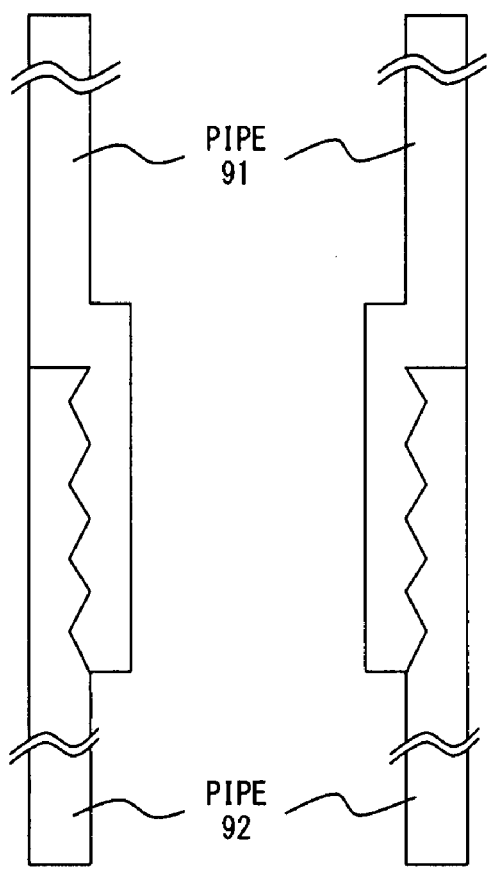
F I G. 17 A
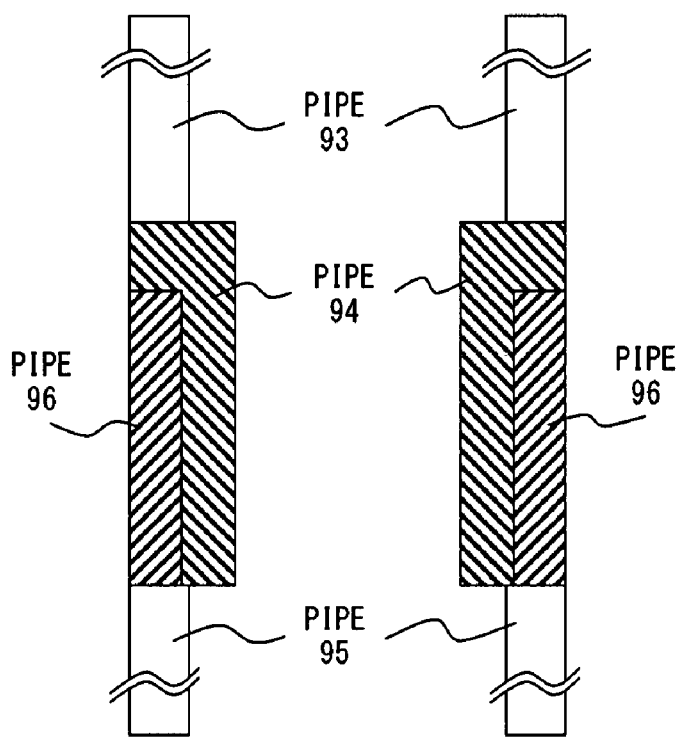
F I G. 17 B

ANALYSIS MODEL GENERATION PROGRAM, ANALYSIS MODEL GENERATION APPARATUS, ANALYSIS MODEL GENERATING METHOD, AND METHOD FOR MANUFACTURING APPARATUS WITH ANALYSIS MODEL GENERATING METHOD

BACKGROUND OF THE INVENTION

1. Field of the Invention

The present invention relates to a technique of generating an analysis model for analysis of an object from a three-dimensional geometric model obtained by modeling the three-dimensional geometry of the object.

2. Description of the Related Art

Recently, a three-dimensional CAD (computer aided design) system has been widely used in designing an apparatus including a plurality of parts. The three-dimensional CAD is used in various devices such as an integrated circuit, a machine, a vehicle, a building, etc. With the improvement of computer performance, a more complicated three-dimensional geometric model can be generated by the three-dimensional CAD system. In the following descriptions, the three-dimensional geometric model is simply referred to as a "geometric model". At present, a computer having the performance, which is sufficient to process a geometric model as detailed as the form of an ultimate product, has become widespread. Therefore, there are not a few cases where design models are as detailed as practical product models.

On the other hand, a mechanical analysis of the distortion caused by applying external force on an apparatus and the strength of the apparatus can also be generally performed by a computer.

The performance of a number of computers being widely used is sufficient to process a detailed specific geometric model, but insufficient to perform a numerical analysis using the detailed specific geometric model as an analysis model. Therefore, it is common that an analysis model for analysis is generated in addition to a geometric model for design, and a numerical analysis is performed in a finite-element method using the analysis model.

For example, there is an apparatus having a locker unit structure including a metal girder, top plate, and floor plate. The locker unit structure is a skeleton framework, and stores various parts in the internal space. The ultimate product can store various parts, but it is important to mechanically analyze the locker unit structure.

In the locker unit structure, it is common that fastening parts such as a screw, a bolt, a rivet, welding, etc. are used in fastening sheet-metal parts such as a girder, a top plate, a floor plate, etc. Recently, including the fastening parts, a specific geometric model defined for the detailed geometry of a metal sheet is often generated using the three-dimensional CAD system. However, such a geometric model is so specific that a large volume of computer resources are required in analysis when it is used as an analysis model.

For example, when screws or bolts are used in a fastening operation, there is naturally a screw hole. When an analyzing process is performed in the finite-element method, a plurality of nodes of a mesh is located along the outline of the hole, and the nodes have to be coupled to other nodes of the mesh. As a result, there is an increasing number of nodes directly or indirectly, and a large volume of computer resources are required in analysis. Therefore, it is impractical to utilize a detailed specific geometric model as an analysis model with the performance of the currently marketed computer taken into account.

Therefore, it is common to generate an analysis model by simplifying a specific geometric model. To simplify the model, only a basic structure is first generated with the assembly parts omitted as much as possible. Especially relating to a thin plate such as sheet-metal parts, it is common that a solid model generated by the three-dimensional CAD system is replaced with a shell model as a face model. In the shell model, the fastening portion by a screw, a bolt, a rivet, etc. is replaced with point-to-point connection by connecting points using, for example, a beam element.

A shell model is briefly described below with reference to FIGS. 1A and 1B.

FIG. 1A is a perspective view showing two plates 121 and 122 fastened by bolt fastening 123 and 124. FIG. 1A shows the geometric model generated by the three-dimensional CAD system. As shown in FIG. 1A, the geometric model generated by the three-dimensional CAD system is a solid model, and each of the plates 121 and 122 is shown as a geometry having a thickness.

On the other hand, FIG. 1B is a shell model corresponding to FIG. 1A. In FIGS. 1A and 1B, the plate 121 corresponds to a face 125, the plate 122 corresponds to a face 126, the bolt fastening 123 corresponds to point-to-point connection 127, and the bolt fastening 124 corresponds to point-to-point connection 128.

As shown in FIG. 1B, the plates 121 and 122 of the three-dimensional geometries having thicknesses are replaced with the faces 125 and 126 as planes compressed in the thickness direction in the shell model. The faces 125 and 126 are called medial surfaces. The fastening by a bolt, a rivet, welding, etc. is replaced with point-to-point connection by connecting a point on the face 125 to a point on the face 126. In the example shown in FIG. 1B, the two points of bolt fastening 123 and 124 are replaced with the two point of point-to-point connection 127 and 128. However, for example, the fastening by an adhesive can be replaced with n points of point-to-point connection.

An example of using a shell model is described in the patent documents 1 and 2.

The analysis model generation apparatus (analytic model preparing apparatus) described in the patent document 1 automatically retrieves a fastening portion (a joint portion) from a geometric model. In retrieving, the position of the fastening and the type of fastening such as a screw, a bolt, a rivet, welding, etc. is determined. Then, the fastening portion obtained as a result of the retrieval is highlighted, and a user is allowed to confirm whether or not the determination is correct. Thus, the analysis model generation apparatus refers to the joint model preparing object database and models the fastening portion in a shell model for the fastening portion whose position and type have been determined.

The patent document 2 describes a method of stacking a single layer model for each layer and analyzing the model to analyze a multilayer printed circuit board.

[Patent Document 1] Japanese Published Patent Application No. 2001-265836

[Patent Document 2] Japanese Published Patent Application No. 2006-91939

The following steps are required to generate a shell model for analysis from a geometric model.

(1) A step of extracting a basic structure from a solid model having a large volume of information. For example, a step of extracting the plates 121 and 122 as a basic structure from a geometric model shown in FIG. 1A.

(2) A step of replacing a solid model with a shell model. For example, a step of replacing the plates 121 and 122 with the faces 125 and 126.

(3) A step of appropriately replacing a fastening portion. For example, a step of replacing the bolt fastening 123 and 124 with two points of the point-to-point connection 127 and 128.

These steps often require manual operations. Especially, the step (3) above requires determination by a person. However, since not a few apparatuses include 200 to 300 points of fastening portions, there are an enormously large number of operation steps. In addition, it is very difficult to correctly express the rigidity (i.e. stiffness) of the fastening portion, and there is no established method of modeling a fastening portion. Accordingly, there is uneven analysis accuracy.

Although a method for reducing the influence of replacing operations has been studied, the replacement described in (2) above has an influence on the analysis accuracy.

On the other hand, if a geometric model itself is used as is as an analysis model to avoid the above-mentioned problems, a mesh division is performed on the geometric model. Therefore, the number of meshes and the number of nodes configuring the meshes become large, and the analysis requires a large volume of computer resources.

This problem is first caused by a large number of small meshes required for the bolts and nuts used for the bolt fastening 123 and 124 shown in FIG. 1A.

Second, the problem is caused by some nodes of meshes to be set along the outline of the holes through which the bolts penetrate the plates 121 and 122. Then, the meshes including the nodes are radially set on the periphery of the hole. If there is no hole, the plates 121 and 122 are simply rectangular parallelepiped. Therefore, they can be appropriately modeled by coarse meshes, and the number of nodes on the top and bottom surfaces of the plates 121 and 122 is low. However, the diameter of the hole for a bolt is generally much smaller as compared with the sizes of the plates 121 and 122, and there are a plurality of nodes along the periphery of the small hole. Therefore, if nodes are set along the outline of a hole, then meshes are closely set radially on the periphery of the hole, and the closely arranged meshes directly or indirectly increase the number of necessary nodes on the top and bottom surfaces of the plates 121 and 122.

SUMMARY OF THE INVENTION

The disclosed embodiments have been developed to solve the above-mentioned problems. The embodiments aim at utilizing the three-dimensional geometric model more effectively when an analysis model is generated from a three-dimensional geometric model, and reducing the laborious operations of a user.

The analysis model generation program according to an embodiment of the present invention directs a computer to generate an analysis model by processing a three-dimensional geometric model of an apparatus including a plurality of parts. According to an aspect of the present invention, a computer-readable storage medium storing the analysis model generation program is provided.

The analysis model generation program directs the computer to perform: an inputting step of receiving the three-dimensional geometric model as input, and storing the three-dimensional geometric model in a first storage unit; a fastening portion extracting step of referring to a second storage unit storing attribute information about fastening between the parts, and extracting a fastening portion at which a first part and a second part are fastened based on the attribute information and the three-dimensional geometric model; a dividing step of dividing each of the first part and the second part into a first geometry in proximity of the fastening portion and one or more second geometries corresponding to a remaining portion of the first geometry in the three-dimensional geometric model; and an equivalent property value assigning step, being a step with respect to each of the first geometry obtained by dividing the first part and the first geometry obtained by dividing the second part, of referring to a third storage unit storing a parameter depending on the attribute information and a property value depending on a material of the part, calculating an equivalent property value as a property value reflecting fastening based on the parameter and the property value stored in the third storage unit, and assigning the equivalent property value to the first geometry.

Therefore, according to the analysis model generation program, an appropriate equivalent property value can be automatically assigned without a user determining each fastening portion.

Additionally, it is preferable that the analysis model generation program further directs the computer to perform a deleting step of deleting a third part from the three-dimensional geometric model when the fastening portion includes the third part for fastening the first part to the second part.

It is also preferable that the analysis model generation program further directs the computer to perform a filling step of performing a filling operation on a hole in the three-dimensional geometric model when at least one of the first part and the second part has a hole, and the first part and the second part are fastened by engaging the third part in the hole.

By the above-mentioned deleting step and filling step, a three-dimensional geometric model whose geometry is simplified can be obtained as an analysis model.

The analysis model generation apparatus according to an aspect of the present invention is an apparatus performing an operation similar to the operation of the above-mentioned analysis model generation program performed by directing the computer. The analysis model generating method according to an aspect of the present invention is a method of the analysis model generation program to direct the computer to perform the operation.

A method of manufacturing an apparatus including a plurality of parts can include the analysis model generating method.

An analysis model obtained by any embodiments of the present invention is not a face model, but a three-dimensional geometric model. Therefore, the three-dimensional information included in the original three-dimensional geometric model can be effectively utilized in an analysis. Furthermore, since the process is performed by a computer as described above, the manual operation by a user can be reduced.

BRIEF DESCRIPTION OF THE DRAWINGS

FIGS. 2A through 2E are explanatory views illustrating the outline of the method of generating an analysis model from a geometric model in a mode for embodying the present invention;

FIG. 3 shows an example of a specific geometric model generated by a three-dimensional CAD system;

FIGS. 7A and 7B are views of a candidate area added to an enlarged part of FIG. 3;

FIG. 8A is a sectional view of FIG. 7B;

FIG. 8B is a side view of FIG. 7B;

FIG. 10 shows an example of a fastening coefficient definition table;

FIG. 11 shows an example of a dimension coefficient definition table relating to bolt fastening;

FIG. 12 shows an example of a fillet weld coefficient definition table;

FIG. 14 shows an example of a material and property value correspondence table storing various property values;

FIGS. 16A and 16B are explanatory views of examples of fastening using an L-shaped metal fixture;

FIGS. 17A and 17B are explanatory views of examples of fastening using threads.

DESCRIPTION OF THE PREFERRED EMBODIMENTS

Figure 1A:
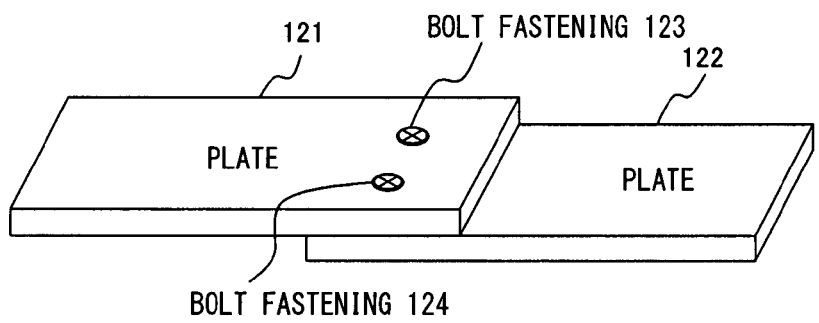
FIGS. 1A and 1B are explanatory views of a shell model.
Figure 1B:
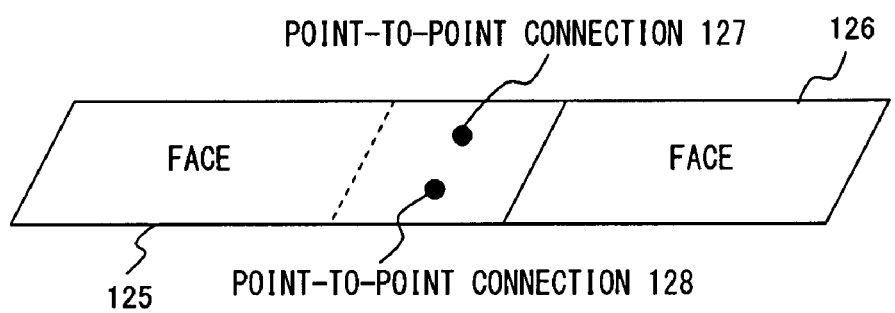

The modes for embodying the present invention are described below with reference to the attached drawings.

For comprehensibility of the descriptions, the following two points are assumed. The assumption is not to limit the type of an analysis model or the analyzing method.

An analysis model is a model to be used in performing a mechanical analysis.

A mesh division is performed on the geometry of a generated analysis model in order to perform an analysis by a finite-element method.

FIGS. 2A through 2E are explanatory view for illustrating the outline of the method of generating an analysis model from a geometric model according to a mode for embodying the present invention. FIG. 2A is a perspective view of an input geometric model. FIG. 2B is a sectional view of the model shown in FIG. 2A. FIG. 2E is a perspective view of an output analysis model. FIG. 2D is a sectional view of the model shown in FIG. 2D. FIG. 2C is a sectional view similar to FIGS. 2B and 2D, and shows the progress of the process from FIG. 2B to FIG. 2D.

In the geometric model shown in FIG. 2A, plates 1 and 2 are fastened by bolt fastening 3 and 4. For convenience of reference, the x, y, and z axes are shown on the right. For easy explanation, it is assumed that the plates 1 and 2 are rectangular parallelepiped, each edge of the rectangular parallelepiped is parallel to either of the x, y, or z axes, and the thickness direction of the plates 1 and 2 is the z-axis direction.

FIG. 2B is the sectional view of the geometric model shown in FIG. 2A taken along the plane parallel to the yz plane. In the FIGS. 2A through 2E, structures of the bolt fastening 3 and 4 are the same. FIG. 2B is a sectional view of the portion corresponding to the bolt fastening 3. As shown in FIG. 2B, the bolt fastening 3 refers to the fastening using a bolt 5 and a nut 6. Any appropriate material can be used for the plates 1 and 2, bolt 5 and nut 6.

As shown in FIGS. 2A and 2B, a geometric model is modeled even for small parts such as the bolt 5 and the nut 6. Naturally, holes penetrated by the bolt 5 in the plates 1 and 2 are also modeled. Therefore, if the geometric model is used as an analysis model, a large amount of computer resources are required in an analysis as described above.

Therefore, in this mode for embodying the present invention, the geometric model shown in FIGS. 2A and 2B is not used as is as an analysis model, but the process of obtaining FIG. 2C from FIG. 2B and the process of obtaining FIG. 2D from FIG. 2C are performed. The process of obtaining FIG. 2C from FIG. 2B is a process of simplifying a geometric model and eliminating the cause of an increase in the number of meshes and nodes. The process of obtaining FIG. 2D from FIG. 2C is a process of providing necessary information for an analysis.

Practically, FIG. 2C can be obtained by deleting the bolt 5 and the nut 6 from FIG. 2B and filling the holes in the plates 1 and 2, through which the bolt 5 penetrates the plates 1 and 2. FIG. 2C shows a contact surface 7 between the plates 1 and 2. The Plates 1 and 2 contact each other on the contact surface 7. Assume that the range of the contact surface 7 in the y-axis direction is $y_1 \leq y \leq y_2$. That is, assume that the leftmost y coordinate of the plate 2 is $y_1$ and the rightmost y coordinate of the plate 1 is $y_2$. In this case, a fastening portion 8 where the plates 1 and 2 are fastened includes the entire range represented by $y_1 \leq y \leq y_2$ on the plates 1 and 2. In FIG. 2C, since the geometry is more simplified than in FIG. 2B, the number of meshes and nodes is lower than in the mesh division on the geometric model shown in FIG. 2B when the mesh division is performed on the geometric model shown in FIG. 2C.

In FIG. 2B, the plates 1 and 2 are fastened using the bolt 5 and the nut 6, but the method of fastening a plurality of parts is not limited to this.

For example, when parts are fastened by welding, a subtle change in geometry of base metal by the welding and the geometry of filler metal may not be reflected by a geometric model, or when parts are fastened by an adhesive, the thickness of the adhesive may be ignored when a geometric model is generated. In this case, it can be regarded that the geometric model generated by the three-dimensional CAD system has entered the state shown in FIG. 2C. Therefore, the process obtaining FIG. 2C from FIG. 2B is omitted in such a case.

Otherwise, there can be a case where the general geometry of filler metal is modeled into a geometric model in the fastening by welding, for example, welding 32 shown in FIG. 3. In this case, the process of obtaining FIG. 2C from FIG. 2B can be changed into a process of only deleting parts. That is, the geometry of filler metal is deleted from a geometric model, but the process is changed into a process of not performing a filling process because there is no hole originally unlike the fastening using the bolt 5.

Back in the example shown in FIG. 2C, the obtained geometric model shown in FIG. 2C is the same as the geometric model representing the contact between one portion on the lower surface of a plate having no holes and one portion on the upper surface of another plate having no holes. On the other hand, since the plates 1 and 2 are practically fastened by the bolt fastening 3 and 4 at the fastening portion 8, an analysis model has to reflect the fastening. FIGS. 2D and 2E show the analysis models reflecting the fastening in FIG. 2C.

Practically, the plate 1 is divided into two geometries, that is, plates 10 and 11, the plate 2 is divided into two geometries, that is, plates 20 and 21, the plate 11 is assigned a property value different from the property value of the original plate 1, the plate 21 is assigned a property value different from the property value of the original plate 2, and appropriate restriction conditions are set between the plates 10 and 11, the plates 20 and 21, and the plates 11 and 21, thereby obtaining an analysis model of FIG. 2D from FIG. 2C.

A division surface 12 for division of the plate 1 into the plates 10 and 11 is a plane expressed by $y=y_1$, and a division surface 22 for division of the plate 2 into the plates 20 and 21 is a plane expressed by $y=y_2$. Although a contact surface 9 is practically the same surface as the contact surface 7, the reference numeral 7 is used in representing the contact between the plates 1 and 2 while the reference numeral 9 is used in representing the contact between the plates 11 and 21.

FIG. 2D shows by diagonal lines that property values different from those of the original plates 1 and 2 are assigned to the plates 11 and 21. Generally, the device produced by fastening and assembling a plurality of parts is lower in strength of fastening portions than an incorporated one-piece device. Then, the property value corresponding to the low strength is assigned to the plates 11 and 12.

The above-mentioned restriction conditions are practically the following restriction conditions.

The plates 10 and 11 contact each other on the division surface 12, and are not separate from each other or the contact positions are not displaced. That is, any external force cannot prevent the contact status between the plates 10 and 11 on the division surface 12.

Similarly, the plates 20 and 21 contact each other on the division surface 22, and are not separated or the contact position between them is not displaced.

Similarly, the plates 11 and 21 contact each other on the contact surface 9, and are not separated or the contact position between them is not displaced.

These restriction conditions specify the two geometries of the plates 10 and 11 practically corresponding to one plate 1, the two geometries of the plates 20 and 21 practically corresponding to one plate 2, and the fastening between the plates 1 and 2.

Microscopically, the above-mentioned restriction conditions may not reflect actual deformation or displacement. However, if the entire analysis object is macroscopically considered, assigning respective appropriate property values to the plates 11 and 21 enables high accuracy in analyzing how strong the force applied to the fastening portion 8 is when the force causes displacement or deformation of the fastening portion 8 in excess of an allowance.

For example, when large force is applied in the direction of separating the plates 1 and 2, the plates 1 and 2 deform around the contact surface 7, and the contact between the plates 1 and 2 may not be maintained in a portion in the range of $y_1 \leq y \leq y_2$. That is, practically, the restriction conditions between the plates 11 and plate 21 may not hold.

However, although an analysis is performed under the above-mentioned restriction conditions, the deformation must occur when the force is applied if an appropriate property value is assigned to the plates 11 and 21. For example, in the analysis with applying the force in the direction of separating the plates 1 and 2, the plates 11 and 21 deform, the plate 10 deforms around the division surface 12, or the plate 20 deforms around the division surface 22. Therefore, by assigning respective appropriate property values to the plates 11 and 21, it is expected that the strength of the force when the deformation exceeds the allowance in an analysis model is substantially equal to the strength of the force when the plates 1 and 2 displace or deform in excess of the allowance in the real world. Then, the assignment of the appropriate property values can be determined depending on an experiment, etc.

An analysis model generated as described above has the following characteristics.

First, the analysis model is a model having a three-dimensional geometry as shown in FIG. 2E. Therefore, unlike the case where a shell model is used, there is no influence on the analysis accuracy caused by the replacement of the three-dimensional geometry with a plane.

Second, the analysis model has a simpler geometry than the original geometric model shown in FIG. 2A. Therefore, the model shown in FIG. 2E requires much less amount of computer resources than the model shown in FIG. 2A requires, to perform an analysis in the finite-element method by performing a mesh division.

Third, by assigning appropriate property values to the plates 11 and 21, the level of the effect of the simplified geometry on the analysis accuracy can be suppressed to such an extent that no practical problem occurs. Furthermore, if a library for determination of an appropriate property value is generated in advance, a property value can be automatically assigned, thereby reducing the load of a user and the same analysis model can be generated by any user.

FIG. 3 shows an example of a detailed geometric model generated by a three-dimensional CAD system. Since the geometric model is detailed, FIG. 3 can show the exact structure to be analyzed.

A locker unit structure 30 shown on the right of FIG. 3 is a substantially rectangular parallelepiped structure. The locker unit structure 30 is used for various purposes, for example, it is sectioned by a plurality of plates, and each of the sectioned spaces stores a mechanical part. The locker unit structure 30 includes the vertical columns, the horizontal girders, and frames for attachment of the top plate and floor plate. In the example shown in FIG. 3, it is assumed that the columns and girders are all made of sheet metals.

The left portion of FIG. 3 shows an enlarged part of the locker unit structure 30, and the components of the locker unit structure 30 are interconnected by bolt fastening 31, welding 32, rivet fastening 33, etc. The welding 32 shown in FIG. 3 is fillet weld and shown by the geometry of a triangular pillar. It is not the correct geometry of a filler metal, but the convenient geometry representing the welding position and length.

Figure 4:
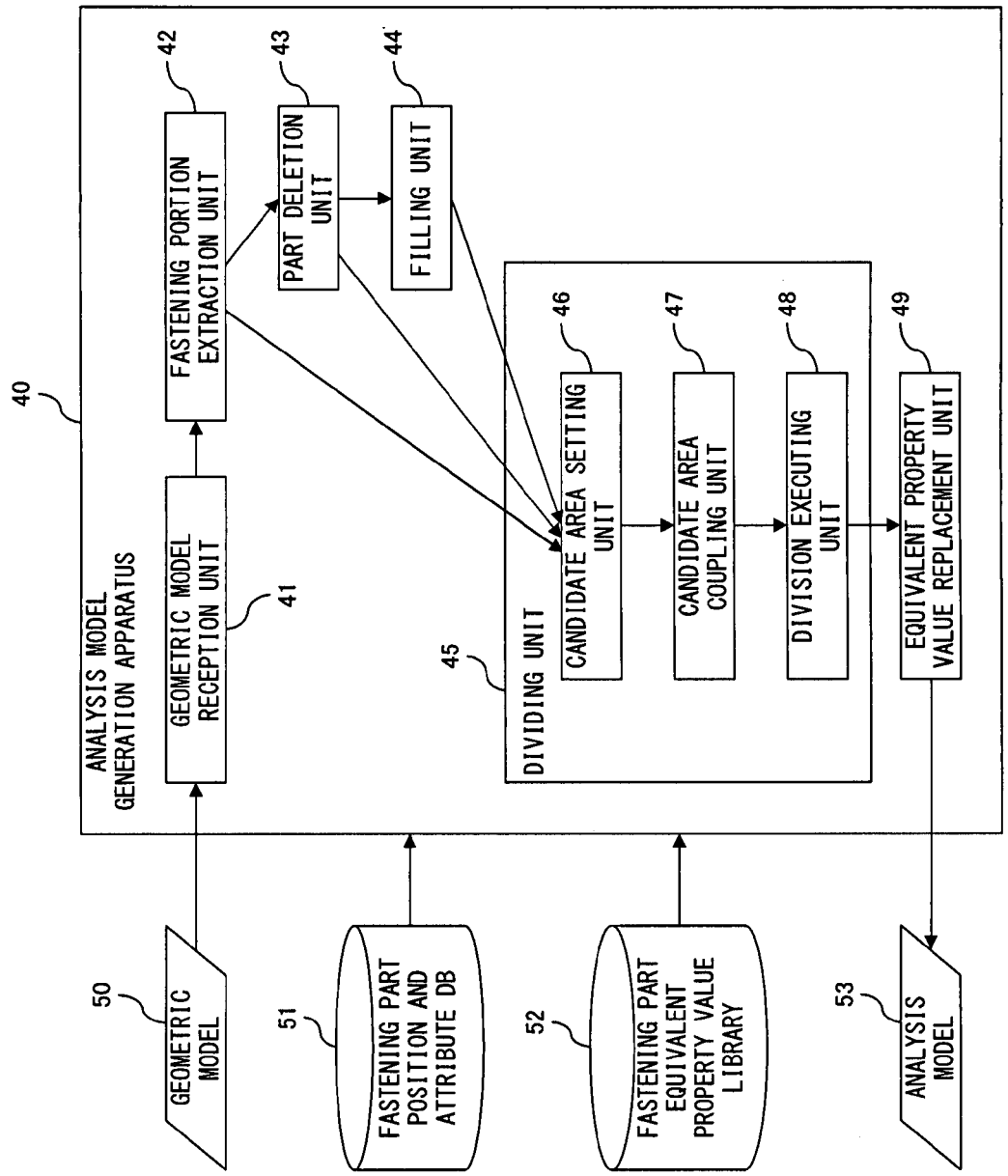
FIG. 4 is a block diagram showing the function of the analysis model generation apparatus.

FIG. 4 is a block diagram showing the functional configuration of an analysis model generation apparatus 40 according to a mode for embodying the present invention. FIG. 4 also shows a geometric model 50 as input to the analysis model generation apparatus 40, an analysis model 53 as output from the analysis model generation apparatus 40, a fastening part position and attribute DB 51 (DB is short for database) used by the analysis model generation apparatus 40, and a fastening part equivalent property value library 52 used by the analysis model generation apparatus 40.

The analysis model generation apparatus 40 includes a geometric model reception unit 41 for receiving the detailed geometric model 50 generated by the three-dimensional CAD system as input, a fastening portion extraction unit 42 for extracting a fastening portion based on the geometric model 50, a part deletion unit 43 for deleting a part such as the bolt 5 and the nut 6 shown in FIG. 2B from the geometric model 50, a filling unit 44 for filling a hole made by the part-deleting operation, a dividing unit 45 for dividing each of the parts included in the fastening portion, and an equivalent property value replacement unit 49 for assigning a property value to a divided geometry. For example, the plates 1 and 2 shown in FIGS. 2A through 2C are examples of the parts included in the fastening portion, and the dividing unit 45 divides the plate 1 into the plates 10 and 11 shown in FIGS. 2D and 2E, and divides the plate 2 into the plates 20 and 21 shown in FIG. 2D and 2E. The equivalent property value replacement unit 49 assigns a property value to the plates 11 and 21 as the geometries after the division. The data treated in the process by the equivalent property value replacement unit 49 is output as the analysis model 53 from the analysis model generation apparatus 40.

The dividing unit 45 includes: a candidate area setting unit 46 for setting for each fastening portion the candidate area corresponding to the fastening portion; a candidate area coupling unit 47 for combining a plurality of candidate areas into one candidate area when they satisfy a predetermined condition; and a division executing unit 48 for dividing a part into a plurality of geometries by defining the surface on which the surface of a candidate area crosses the part as a division surface.

In FIG. 4, an arrow is issued to the dividing unit 45 from each of the three units, that is, the fastening portion extraction unit 42, the part deletion unit 43, and the filling unit 44. To be more correct, the three arrows are directed to the candidate area setting unit 46 of the dividing unit 45. These three arrows correspond to the process that can be omitted depending on the type of fastening. For example, a fastening portion by the adhesive or welding may not be reflected as geometry in a geometric model. In this case, it is not required to delete a part nor required to fill a hole. Therefore, it corresponds to the arrow from the fastening portion extraction unit 42 to the dividing unit 45. The fastening portion by the fillet weld reflecting the geometry of a filler metal in a geometric model such as the welding 32 shown in FIG. 3 requires only deleting the geometry of the filler metal, and does not require filling. Therefore, it corresponds to the arrow from the part deletion unit 43 to the dividing unit 45. The fastening portion by a bolt, a screw, and a rivet requires both deleting a part and filling a hole, thereby corresponding to the arrow from the filling unit 44 to the dividing unit 45.

Each component of the analysis model generation apparatus 40 shown in FIG. 4 is a function block. The function block can be realized by a dedicated hardware circuit, but can be realized by software. In the case of software, the fastening part position and attribute DB 51 and the fastening part equivalent property value library 52 can be stored in the storage device of a computer that realizes the analysis model generation apparatus 40, and can be stored in the storage device accessible from the computer over a network.

Figure 5:
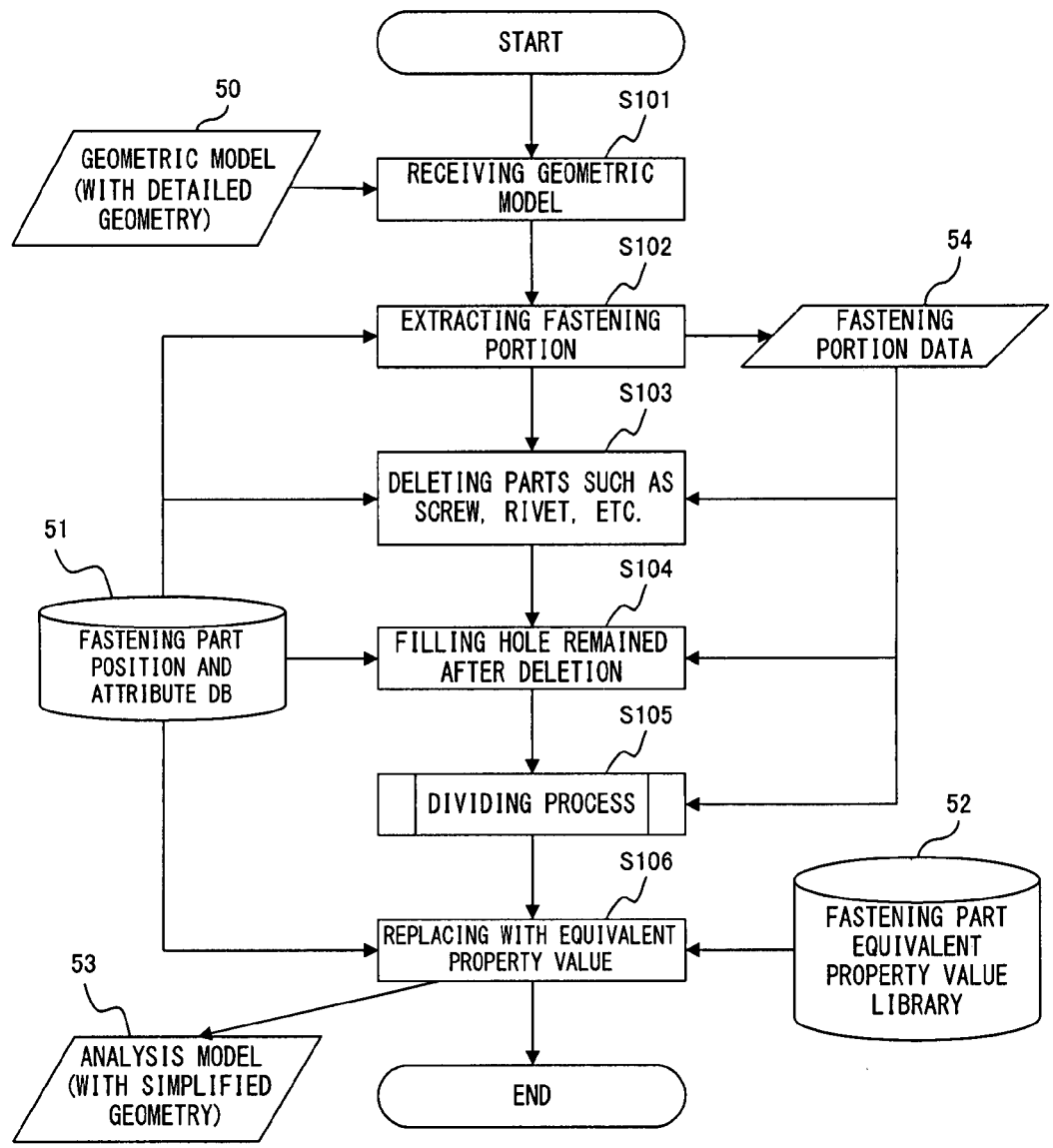
FIG. 5 is a flowchart of the process of generating an analysis model from a geometric model.
Figure 6:
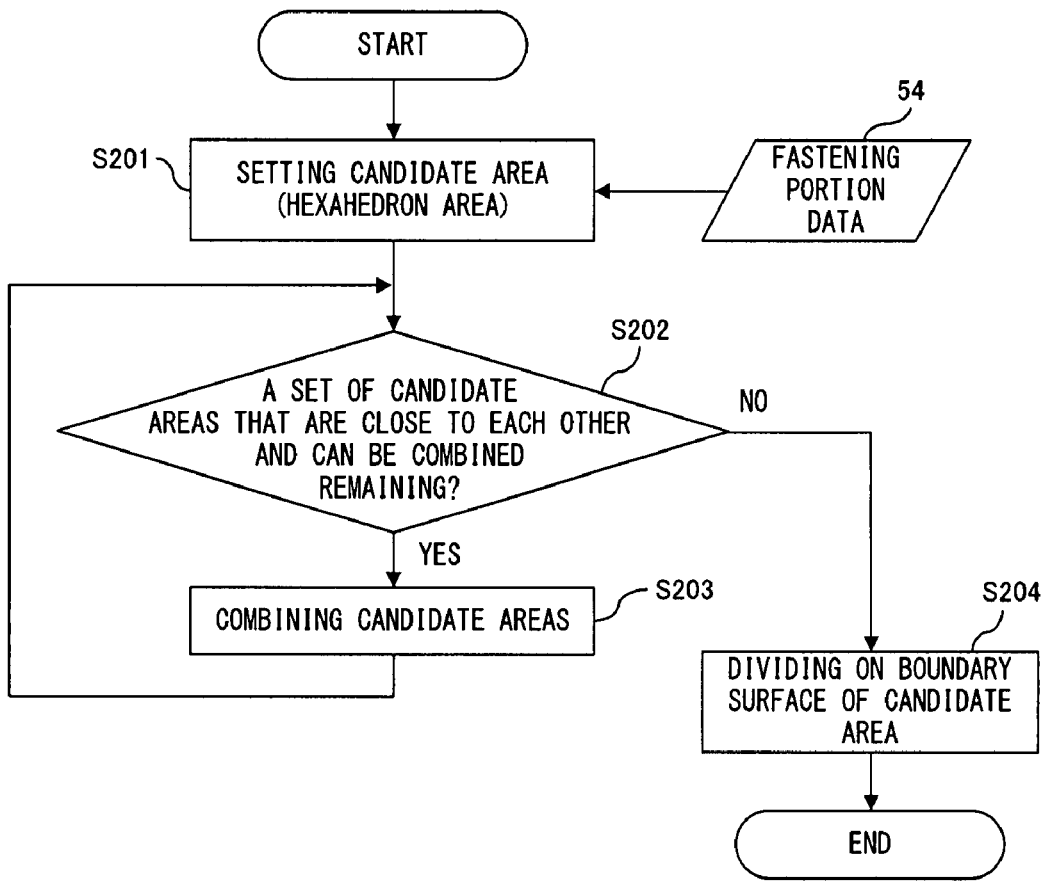
FIG. 6 is a flowchart of the dividing process.

Next, the process performed by the analysis model generation apparatus 40 is described with reference to FIGS. 5 and 6. FIG. 5 is a flowchart of the process of the analysis model generation apparatus 40 generating the analysis model 53 from a geometric model 50, and FIG. 6 is a flowchart of the dividing process in the generating process.

In step S101, the geometric model reception unit 41 receives the geometric model 50, stores it in the memory, and control is passed to step S102. The geometric model 50 is a detailed geometric model generated by a three-dimensional CAD system. A practical example is FIG. 3. An example of memory is RAM 103 shown in FIG. 18.

In step S102, the fastening portion extraction unit 42 extracts a fastening portion from the geometric model 50 received by the geometric model reception unit 41 with reference to the fastening part position and attribute DB 51. The fastening portion extraction unit 42 stores an extracted result as fastening portion data 54 in the memory for later processing. An example of the memory is the RAM 103 shown in FIG. 18.

The fastening part position and attribute DB 51 stores the position and the attribute of a fastening part. The "fastening part" includes not only the parts such as a bolt, a nut, a rivet, etc., but also welding such as spot welding, fillet weld, etc. The "fastening part" indicating welding may not be reflected as a geometry in the geometric model 50. For example, spot welding is not represented as a geometry in the geometric model 50, and there can be the possibility that only the position and attribute of welding are stored as data.

The fastening portion extraction unit 42 acquires the information about the position and attribute of the fastening part included in the geometric model 50 with reference to the fastening part position and attribute DB 51. An example of the attribute used in step S102 is the geometry, dimension, type, material, etc. of a fastening part.

For example, with reference to the fastening part position and attribute DB 51, the fastening portion extraction unit 42 acquires the information about where a bolt is used, what are the diameter and the length of the bolt, in which direction the bolt is used, etc. Similarly, the fastening portion extraction unit 42 also acquires the information about a nut. As a result, the fastening portion extraction unit 42 can extract a fastening portion.

For example, when the geometric model 50 is a model as shown in FIG. 2A, the fastening portion extraction unit 42 acquires the information about the position and attribute of the bolt 5 and the nut 6 shown in FIG. 2B from the fastening part position and attribute DB 51 in step S102. Then, the fastening portion extraction unit 42 recognizes the following according to the acquired information and the assembly information included in the geometric model 50.

The bolt 5 penetrates the through hole in the nut 6. That is, a combination of the bolt 5 and the nut 6 is used.

A part of the plate 1 and a part of the plate 2 are placed between the bolt 5 and the nut 6.

The head of the bolt 5 contacts the top surface of the plate The nut 6 contacts the bottom surface of the plate 2.

The plates 1 and 2 contact each other on the contact surface 7.

There is a through hole in each of the plates 1 and 2, and the position of the through hole matches the position of the bolt 5.

Based on the above-mentioned recognition, the fastening portion extraction unit 42 extracts the fastening portion 8. The method of determining the area for extraction as the fastening portion 8 depends on the mode for embodying the present invention.

For example, in the case of the example shown in FIG. 2B, the fastening portion 8 can be an area of the smallest spheroid in the area satisfying the conditions of including the bolt 5 and the nut 6 as fastening parts, the z coordinate including the range from the bottom surface of the plate 2 to the top surface of the plate 1, and the x coordinate and the y coordinate including the range of the contact surface 7. Otherwise, the fastening portion 8 can be the area of the smallest rectangular parallelepiped in the area satisfying the above-mentioned conditions. Otherwise, the fastening portion 8 can be an area set as broader than the above-mentioned smallest area by a predetermined margin. That is, a practical format of the fastening portion data 54 and the practical geometry and range of the area extracted as a fastening portion can be arbitrarily determined depending on embodiments so far as the necessary information can be obtained, in the process in steps S103 through S105 described later, from the fastening portion data 54 stored in step S102.

After the fastening portion data 54 is stored, control is passed to step S103.

In step S103, the part to be deleted from the parts included in the fastening portion extracted in step S102 is deleted by the part deletion unit 43 from the geometric model 50. The geometric model after the deletion is referred to by a reference numeral "50*b*", but is not shown in the attached drawings. Specifically, a part to be deleted is stored as a fastening part in the fastening part position and attribute DB 51. In other word, a part to be deleted is a part other than a basic component such as a column, a girder, etc. in the parts configuring a structure to be analyzed, and a relatively small part used to fasten the basic components.

There also is a solely used fastening part such as a nail, fastening parts for use in a combination of two parts such as a bolt and a nut, and in a combination of three parts such as a bolt, a nut, and a washer. A plurality of fastening parts used in a combination are all deleted in step S103 in many cases. However, in the example shown in FIGS. 16A and 16B, an L-shaped metal fixture 77a and bolts 78a and 79a are used as a combination, but the L-shaped metal fixture 77a is not deleted.

On the other hand, a part not to be deleted in the parts included in the fastening portion is a basic component configuring a structure to be analyzed. For example, the fastening portion 8 shown in FIG. 2B includes the plates 1 and 2. However, since the plates 1 and 2 are basic components, the portion included in the fastening portion 8 of the plates 1 and 2 is not to be deleted from the geometric model 50. The fastening parts such as welding not reflected as a geometry may be deleted in one embodiment, although these parts may not be deleted in another embodiment.

In FIG. 5, the arrow indicates that the fastening portion data 54 and the fastening part position and attribute DB 51 are referred to in step S103.

For example, in the case of the geometric model 50 relating to the locker unit structure 30 shown in FIG. 3, the bolt and the nut not shown in FIG. 3 that are used in the bolt fastening 31, the welding 32 represented by the geometry of a triangular pillar, and the rivet used in the rivet fastening 33 are deleted in step S103.

After deleting all parts to be deleted for all fastening portions extracted in step S102, control is passed to step S104.

In step S104, the hole remaining in a geometric model 50b after deleting the parts in step S103 is filled by the filling unit 44. In step S104, the filling unit 44 refers to both fastening portion data 54 and fastening part position and attribute DB 51, and FIG. 5 shows it using the arrow.

The hole to be filled in step S104 is only the hole in which the part deleted in step S103 has been engaged. For example, as with the girder in the horizontal direction shown in FIG. 3 corresponding to a girder 35 shown in FIGS. 7A and 7B, there is a part having a hole regardless of fastening. The hole regardless of fastening is not to be filled.

Therefore, the filling unit 44 refers to the fastening portion data 54 and the fastening part position and attribute DB 51 to determine whether or not the hole currently being regarded in the holes included in the geometric model 50b is a hole in which the part deleted in step S103 has been engaged. The filling unit 44 fills only the hole to be filled based on the determination. The process of filling the hole is performed on the geometric model 50b. In the following descriptions, the geometric model after the filling process is referred to by the reference numeral "50c", but is not shown in the attached drawings. The geometric model 50c corresponds to the model shown in FIG. 2C.

When all holes to be filled are completely filled, control is passed to step S105.

The dividing process in step S105 is a process to be performed by the dividing unit 45 on the geometric model 50c. The outline of the process is described below with reference to the example shown in FIGS. 2C through 2E as a dividing process for dividing the plate 1 into the plates 10 and 11 and the plate 2 into the plates 20 and 21. In FIGS. 2A through 2E, the geometric model 50 is relatively simple for easier description. Therefore, in the example shown in FIG. 2D, the dividing unit 45 divides the plate 1 on the plane indicating $y=y_1$ and divides the plate 2 on the plane indicating $y=y_2$. This dividing process is performed based on the boundary of the range indicating $y_1 \leq y \leq y_2$, the range corresponding to the contact surface 7. That is, the plane indicating $y=y_1$ is a plane including the division surface 12, and the plane indicating $y=y_2$ is a plane including the division surface 22.

However, the geometric model 50 having a complicated geometry such as the locker unit structure 30 shown in FIG. 3 is practically input to the analysis model generation apparatus 40. Then, in step S105, a process more complicated than that of the example shown in FIG. 2D is performed.

FIG. 6 is a flowchart of the details of the dividing process. As a practical example, the process shown in FIG. 6 is described with reference to FIGS. 7A and 7B obtained by enlarging a part of FIG. 3, FIG. 8A as a sectional view of FIG. 7B, and FIG. 8B as a side view of FIG. 7B.

FIGS. 7A and 7B are obtained by adding candidate areas 61 through 63 to the enlarged view of a part of the bolt fastening 31 shown in FIG. 3. As shown in FIG. 7A, a column 34 and a girder 35 are fastened by two fastening portions 38 and 39. A bolt 36 and a nut not shown in the attached drawings are used for the fastening portion 38, and a bolt 37 and a nut not shown in the attached drawings are used for the fastening portion 39.

FIGS. 7A and 7B show x-, y-, and x-axes for convenience of reference. As shown in FIG. 3, the locker unit structure 30 has approximately rectangular parallelepiped geometry, and each edge of the rectangular parallelepiped is parallel to either of the x-, y-, or z-axes. Furthermore, as shown in FIGS. 7A and 7B, the longitudinal direction of the column 34 is parallel to the z-axis, and the longitudinal direction of the girder 35 is parallel to the x-axis. The geometry of the girder 35 is not flat plane-shaped. The section of girder 35, taken along the plane parallel to the yz plane, has four bent portions as shown in FIG. 8A. There are the fastening portions 38 and 39 above and below the bent portions respectively.

Back in FIG. 6, the candidate area setting unit 46 refers to the fastening portion data 54 in step S201, and sets a candidate area on the geometric model 50c not shown in attached drawings. In this mode for embodying the present invention, the geometry of the candidate area is rectangular parallelepiped, and since a rectangular parallelepiped is a hexahedron, the candidate area is also called a hexahedron area.

In the example shown in FIG. 2D, a division is made at the position of $y=y_1$ and the position of $y=y_2$ corresponding to the division surfaces 12 and 22. The dividing positions are, as described below, determined by the surfaces of a three-dimensional area. The surface of the area is the boundary between the inner and outer areas of the area, and the boundary determines the dividing position and the division surface. The candidate area set in step S201 is a candidate for the area.

In this mode for embodying the present invention, the candidate area setting unit 46 first recognizes the position of the fastening portion with reference to the fastening portion data 54 in step S201, and sets a rectangular parallelepiped area including the recognized fastening portion as a candidate area. Each edge of the rectangular parallelepiped is parallel to either of the x-, y-, or z-axes.

As described above, there are various practical geometries of the fastening portion depending on modes of embodiments. For example, when the fastening portion is extracted in step S102 as a rectangular parallelepiped indicating:

$$x_1 \leq x \leq x_2, y_1 \leq y \leq y_2, \text{and } z_1 \leq z \leq z_2,$$

the extracted rectangular parallelepiped of the fastening portion itself can be set as a candidate area in step S201.

FIG. 7A shows the candidate area 61 corresponding to the fastening portion 38, and the candidate area 62 corresponding to the fastening portion 39. The candidate area 61 includes the portion near the contact surface between the column 34 and the girder 35. The same holds true with the candidate area 62. Although FIG. 7A shows both of the bolts 36 and 37, they are shown for convenience of description, and the bolts 36 and 37 have already been deleted from the geometric model 50c and do not exist in the geometric model 50c in step S201.

In FIG. 7A, the candidate areas 61 and 62 have some margins in the x, y, and z directions. For example, since there is a margin in the x direction, the left end of the candidate area 61 is left to the left end of the column 34.

Figure 9:
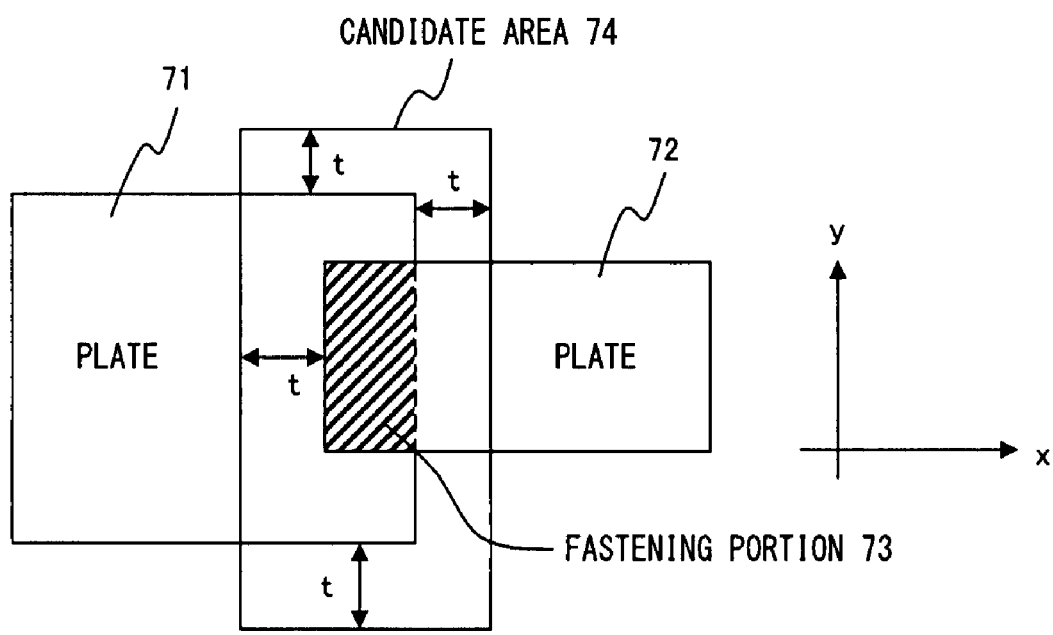
FIG. 9 is an explanatory view of the margin of a candidate area.

A candidate area does not necessarily require a margin, and the area of a fastening portion can exactly match a candidate area. However, there is a merit in providing a margin for a candidate area. FIG. 9 is an explanatory view of the margin of a candidate area.

FIG. 9 is a top view of an example of fastening a plate 71 to a plate 72 at a fastening portion 73 in any method. In FIG. 9, the thickness direction of the plates 71 and 72 is the z-axis direction, and the plus side of the z-axis is a top surface side. In FIG. 9, the fastening portion 73 has a rectangular parallelepiped geometry, the ranges of the x- and y-coordinates of the fastening portion 73 are the same as the range of the contact surface of the plates 71 and 72, and the range of the z-coordinate of the fastening portion 73 is the range from the bottom surface of the plate 71 to the top surface of the plate 72.

In this example, assume that no margin is set for a candidate area. That is, it is assumed that the area of the fastening portion 73 is used as a candidate area.

Then, in step S204 described later, the plates 71 and 72 are respectively divided by the surface of the candidate area. As a result, the geometries of the plate 71 after the division are the rectangle on the right corresponding to the fastening portion 73 and the remaining portion on the left, that is, a reentering octagon when the top view is shown as in FIG. 9. As compared with a rectangle as the geometry of the plate 71 shown in FIG. 9, the reentering octagon has a more complicated geometry.

As the details are described later, a property value is assigned to the geometry after the division, and an analysis is made using the model in which the assignment is performed as an analysis model. Therefore, when the geometry is complicated by the division, the computer resources required for the analysis also increase for the complicated geometry. On the other hand, the present mode for embodying the present invention originally aims at reducing the amount of computer resources necessary for the analysis by a simplified geometry while maintaining the characteristic of a three-dimensional geometry without replacing a three dimensional solid model with a face model. Therefore, it is desired that the degree of complicating the geometry after the division can be suppressed as compared with the geometry before the division.

One of the methods for the purpose above is setting a margin for a candidate area. In the example shown in FIG. 9, a range wider than that of the fastening portion 73 is set as a candidate area 74. When the plate 71 is divided by the surface of the candidate area 74, the geometries after the division when the top view is shown as in FIG. 9 are two rectangles. The two rectangles are simpler than the above-mentioned reentering octagon.

There are various practical methods of setting a margin depending on the mode for embodying the present invention. In the example shown in FIG. 9, in the x-axis direction a margin with the width t is provided on both sides of the fastening portion 73. The plate 71 is different from the plate 72 in length in the y-axis direction. Therefore, the margin in the y-axis direction is based on the plate 71 longer in the y-axis direction, and the margin with the width t is provided from both ends of the plate 71.

In the example shown in FIG. 9, the widths of the four margins are t, but they can be different each other. The appropriate value of the width of the margin depends on the mode for embodying the present invention. If the width of the margin is too large, a property value assigned object includes a portion far from the fastening portion, thereby failing in obtaining an appropriate analysis result. On the other hand, if the width of the margin is too small, the geometry after the division may not be simple. That is, it is desired that a value of an appropriate margin is determined depending on the size of the apparatus to be analyzed or the geometry of a part being used for the apparatus, and the range of the candidate area is determined using the value.

Back to the description with reference to FIG. 6, if the candidate area setting unit 46 has completely set the candidate area on all fastening portions stored in the fastening portion data 54 in step S201, then control is passed to step S202.

The processes in steps S202 and S203 form a loop, and the processes are repeatedly performed until the determination in step S202 is "NO".

In step S202, the candidate area coupling unit 47 determines whether or not a set of candidate areas that are close to each other and can be combined still remains. If the set remains, the determination is "YES", and control is passed to step S203. If not, the determination is "NO", and control is passed to step S204.

Although there are various practical criteria of the determination in step S202 depending on modes of embodiments, the determination is "YES" when both of the condition that there is a set of candidate areas close to each other and the condition that the set of the candidate areas can be combined is satisfied. An example of a set comprised of two candidate areas is described below, but a set comprised of three or more candidate areas can be used in the processes in steps S202 and S203.

In step S202, the candidate area coupling unit 47 selects two candidate areas from all candidate areas, and determines whether or not the two are close to each other. For example, the candidate area coupling unit 47 may calculate the distance between the central points of the two candidate areas, that is, the central points of the two rectangular parallelepipeds, as the distance between the two candidate areas, and may determine that "the two candidate areas are close to each other" if the distance is equal to or lower than a predetermined threshold.

When two candidate areas contact each other, and when at least parts of them overlap each other, the candidate area coupling unit 47 can determine that the two candidate areas are close to each other. Otherwise, the candidate area coupling unit 47 can make determination based on the following calculation. First, assume that the range of the x coordinate of one candidate area is expressed by $x_1 \leq x \leq x_2$, and the range of the x coordinate of another candidate area is expressed by $x_3 \leq x \leq x_4$. The candidate area coupling unit 47 calculates the distance $\Delta x$ in the x-axis direction of the two candidate areas by the following equations (1-1) through (1-3). The equation (1-1) corresponds to the case where there is an overlap in the x-axis direction, and the equations (1-2) and (1-3) correspond to the case where there is no overlap in the x-axis direction.

$$\Delta x = 0 \text{ (when } x_3 \leq x_2 \text{ or } x_1 \leq x_4) \quad (1\text{-}1)$$

$$\Delta x = x_3 - x_2 \text{ (when } x_2 < x_3) \quad (1\text{-}2)$$

$$\Delta x = x_1 - x_4 \text{ (when } x_4 < x_1) \quad (1\text{-}3)$$

Furthermore, the candidate area coupling unit 47 similarly calculates the difference Δy in the y-axis direction and the difference Δz in the z-axis direction of the two candidate areas. If (Δx+Δy+Δz) is equal to or less than a predetermined positive threshold t, then the candidate area coupling unit 47 determines that the two candidate areas are close to each other. If (Δx+Δy+Δz) is more than t, then the candidate area coupling unit 47 determines that the two candidate areas are not close to each other.

For example, in FIG. 7A, the candidate areas 61 and 62 have the same ranges of the x and y coordinates, and the equation Δx=Δy=0 holds. Δz as the distance between the lower end of the candidate area 61 and the upper end of the candidate area 62 is equal to or less than the threshold t. Therefore, it is determined that the candidate areas 61 and 62 are close to each other.

When there is a set of two candidate areas recognized as close to each other, the candidate area coupling unit 47 next determines whether or not the two candidate areas can be combined. The determination criterion depends on the mode for embodying the present invention. For example, the candidate area coupling unit 47 can determine that the two candidate areas can be combined if they include a common part, and they cannot be combined if they include no common part.

In the example shown in FIG. 7A, the candidate area 61 includes the column 34 and the girder 35, and the candidate area 62 also includes the column 34 and the girder 35. Although it is shown in FIG. 7A, note that the bolt 36 and the bolt 37 have already been deleted from the geometric model 50c and they do not exist in the geometric model 50c in step S202. Therefore, the two parts, that is, the column 34 and girder 35, are common between the candidate areas 61 and 62, and the candidate area coupling unit 47 determines that the candidate areas 61 and 62 can be combined to each other.

There are other criteria of determining whether or not candidate areas can be combined. For example, assume that one candidate area includes L parts where L≧1 holds, another candidate area includes M parts where M≧1 holds, and N parts of them in which N≧0 holds are common between the candidate areas. At this time, there can be the criterion that the candidate areas can be combined if N/(L+M) is equal to or more than a predetermined threshold.

If it is determined "YES" in step S202, the candidate area coupling unit 47 combines the candidate areas of the set and replaces them with one candidate area in step S203.

For example, the set of candidate areas 61 and 62 in FIG. 7A is combined and is replaced with the candidate area 63 shown in FIG. 7B. The candidate area 63 is the smallest rectangular parallelepiped in the rectangular parallelepipeds including the candidate areas 61 and 62. In FIGS. 7A and 7B, since a rectangular parallelepiped with edges each being parallel to either of the x-, y-, or z-axes is adopted as a candidate area, it is very simple to calculate the candidate area after the combination in step S203.

After combining the candidate areas in step S203, control is returned to step S202.

If it is determined "NO" in step S202, the process in step S204 is performed. In step S204, the division executing unit 48 divides on the surface of the candidate area the part that crosses the surface. The process is performed on all surfaces of all candidate areas, and on the geometric model 50c.

For example, since the candidate area 63 shown in FIG. 7B is rectangular parallelepiped, it is a type of hexahedron and has six surfaces. Therefore, the division executing unit 48 identifies a part crossing the surface for each of the six surfaces of the candidate area 63, and divides the part on the surface. In FIG. 7B, the two planes parallel to the xy plane are called the top surface and the bottom surface, the two planes parallel to the xz plane are called the front surface and the back surface, and the two planes parallel to the yz plane are called the left and right side surfaces. Then, in FIG. 7B, the column 34 passes through the top surface and the bottom surface, no part passes through the front surface and the back surface, no part passes through the left side surface, and the girder 35 passes through the right side surface. Therefore, the division executing unit 48 divides the column 34 by the top surface and the bottom surface, and divides the girder 35 by the right side surface.

FIG. 8A shows by the sectional view the division by a plane parallel to the yz plane. FIG. 8B shows the division by the side view viewed from the y-axis direction. Since the column 34 is divided by the top surface and the bottom surface of the candidate area 63, three geometries are generated after the division. The three geometries are shown as the columns 64, 65, and 66 in FIG. 8A in the descending order from the top. The girder 35 is divided by the right side surface of the candidate area 63, and has two geometries after the division. The two geometries are shown as girders 67 and 68 in order from right in FIG. 8B.

Step S204 can be regarded as the process of dividing the original geometry as described above, but can also be regarded as the process of replacing the original geometry with a plurality of geometries after the division and reassembling the geometries.

The reason for combining the candidate areas and then performing the dividing process is the same as the reason for providing a margin for a candidate area. By simplifying the geometry after the division by the dividing process, the amount of computer resources required for an analysis can be reduced. For example, unless the candidate areas 61 and 62 shown in FIG. 7A are combined, the column 34 is divided into five geometries, the girder 35 is divided into three geometries, and the three geometries have complicated shapes. On the other hand, when the division is performed based on the candidate area 63 combined as shown in FIG. 7B, the number of geometries after the division can be suppressed, and the geometry after the division is not so complicated.

If the above-mentioned division is performed on all candidate areas, the process shown in FIG. 6, that is, the step S105 shown in FIG. 5 terminates, and control is passed to step S106 shown in FIG. 5. The geometric model after the process shown in FIG. 6 is referred to by the reference numeral "50d", but is not shown in the attached drawings.

In step S106, the equivalent property value replacement unit 49 refers to the fastening part position and attribute DB 51 and the fastening part equivalent property value library 52, and performs the process of replacing a property value for a geometric model 50d, and outputs the analysis model 53 obtained as a result of the process. That is, in the geometries obtained as a result of the dividing process in step S105, the equivalent property value replacement unit 49 performs the process of replacing a property value on each of the geometries inside the candidate area used in the division.

For example, in the example shown in FIGS. 8A and 8B, the geometries obtained after the division comprises columns 64, 65, and 66, and the girders 67 and 68. In these geometries, the geometries inside the candidate area 63 are the column 65 and the girder 68. Therefore, the objects whose property values are to be replaced in step S106 are only the column 65 and the girder 68, and the two geometries are distinguished by the respective patterns in FIGS. 8A and 8B. In the geometries after the division, the columns 64 and 66 corresponding to the external portion of the candidate area 63 used in the division inherit the property value of the original column 34 before the division, and similarly the girder 67 inherits the property value of the girder 35.

As shown in FIG. 2D and described above, the process in step S106 is a process to assign a property value reflecting the actual fastening. That is, in step S106, the property value is assigned such that the property in the geometry, which is obtained by the dividing process and is in the state without screws, bolts, rivets, and screw holes which are actually existing, can be equivalent to the property of the actual fastening portion by reflecting the property of the actual fastening portion in which screws, bolts, rivets, and screw holes exist. Therefore, the assigned property value can also be referred to as an "equivalent property value".

Assigning an equivalent property value is replacing the original property value with another property value. For example, in FIG. 2D, the plate 11 reflects the property of the fastening portion 8 because of replacement in the plate 11 for replacing the property value of the original plate 1 with another property value. On the other hand, the outside of the candidate area, that is, the plate 10 as the geometry outside the fastening portion 8, inherits the property value of the plate 1 as is, and is not an object whose property value is to be replaced.

Figure 13:
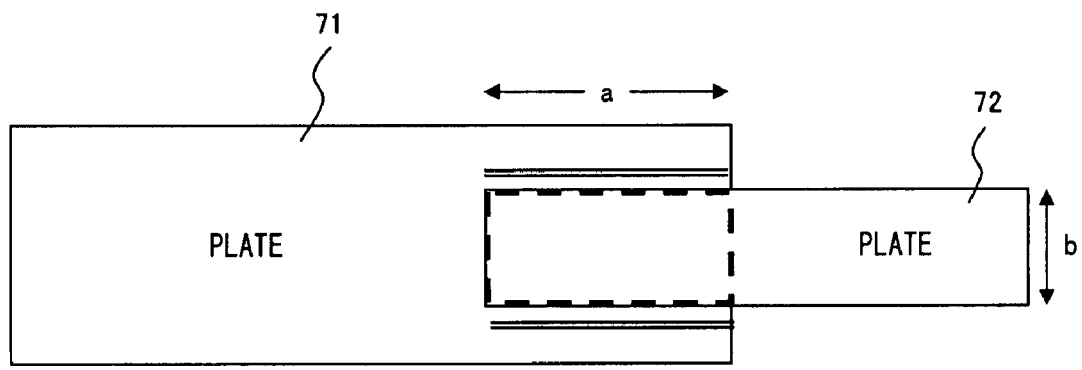
FIG. 13 is an explanatory view about an argument required when fillet weld is performed.

A practical example of the process in step S106 is described below with reference to FIGS. 10 through 14. FIGS. 10 through 12, and 14 show examples of tables included in the fastening part equivalent property value library 52, and FIG. 13 is an explanatory view for supplementary explanation.

In step S106, the equivalent property value replacement unit 49 calculates the equivalent property value to be assigned for all geometries to be processed, and replaces the originally assigned property value with a calculated equivalent property value. An example of a parameter representing the property can be the mass density, a thermal expansion coefficient, a vibration damping factor, etc. in addition to a Young's modulus and a Poisson ratio which relate to rigidity. The anisotropy of a Young's modulus can be considered depending on the material. In step S106, the equivalent property value replacement unit 49 calculates respective equivalent property values on the parameters.

These parameters can be specific values depending on the material. FIG. 14 is a table storing the values. FIG. 14 shows, for example, that the Young's modulus of aluminum is 71 GPa.

The calculation of the equivalent property value in step S106 can be formally expressed by the following equations (2-1) through (2-m).

$$q_1 = f_1(p_1, c_{11}, c_{12}, \dots) \quad (2\text{-}1)$$

$$q_2 = f_2(p_2, c_{21}, c_{22}, \dots) \quad (2\text{-}2)$$

$$\vdots$$

$$q_m = f_m(p_m, c_{m1}, c_{m2}, \dots). \quad (2\text{-}m)$$

The meaning of the equations (2-1) through (2-m) is described as follows.

m indicates how many types of parameters to be calculated. For example, when only a Young's modulus and a Poisson ratio are required in an analysis, m=2. When all parameters of four types shown in FIG. 14 are required in an analysis, m=4.

The subscripts of q, f, and p correspond to the type of parameter representing the property. For example, the subscript of 1 indicates a Young's modulus, and the subscript of 2 indicates a Poisson ratio.

$q_1$ through $q_m$ indicate the equivalent property values to be calculated.

$p_1$ through $p_m$ indicate the original property value. These values are stored in the table shown in FIG. 14 provided for the fastening part equivalent property value library 52. For example, when the subscript of 1 indicates a Young's modulus and the part whose equivalent property value is to be calculated is aluminum, $p_1$=71 GPa.

$f_1$ through $f_m$ are different functions. The number of argument can be different for each function. For example, when the subscript of 1 indicates a Young's modulus, $f_1$ is a function for definition of the method of calculating the value $q_1$ of the Young's modulus to be assigned to, for example, the plate 11 shown in FIG. 2D as a Young's modulus reflecting the fastening based on the original Young's modulus $p_1$ of a part such as the plate 1 shown in FIG. 2A and other one or more arguments ($c_{11}$, $c_{12}$, ... ). These functions are defined, for example, in the fastening part equivalent property value library 52, and can be called from the equivalent property value replacement unit 49.

$c_{jk}$ as the (k+1)th argument of the function $f_j$ is an argument indicating the attribute of fastening. For example, when the geometry whose equivalent property value $q_j$ is to be calculated is the plate 11 shown in FIG. 2D, the plate 11 corresponds to the fastening by the bolt fastening 3 and 4 shown in FIG. 2A and the argument $c_{jk}$ indicates the attribute of the fastening. For example, in a mode for embodying the present invention, a value indicating a type of the fastening being bolt fastening can be assigned as $c_{j1}$, a value indicating existence of two points of bolt fastening 3 and 4 can be assigned as $cj_2$, and a value corresponding to the geometry of the bolt 5 can be assigned as $c_{j3}$. The value of $c_{jk}$ is acquired by the equivalent property value replacement unit 49 referring to the fastening part position and attribute DB 51 and the fastening part equivalent property value library 52.

In the description below, it is assumed that the subscript of 1 indicates a Young's modulus, and the function $f_1$ and the argument $c_{1k}$ are practically described using the calculation of an equivalent property value relating to the Young's modulus as an example.

FIG. 10 shows an example of a fastening coefficient definition table. In FIG. 10, the left column indicates a record number, the central column indicates the type of fastening, and the right column indicates a fastening coefficient. The fastening coefficient is used as an argument $c_{11}$.

For example, the plate 11 shown in FIG. 2D corresponds to the portion fastened by the bolt fastening 3 and 4. Therefore, to calculate the equivalent property value of the plate 11, the equivalent property value replacement unit 49 refers to the second record. As a result, the value of 0.3 is obtained as a fastening coefficient.

FIG. 11 shows an example of a dimension coefficient definition table relating to bolt fastening. In FIG. 11, the left column indicates a record number, the central column indicates the diameter of a bolt, and the right column indicates a dimension coefficient. The dimension coefficient is used as an argument $c_{12}$.

For example, to calculate the equivalent property value of the plate 11 shown in FIG. 2D, the equivalent property value replacement unit 49 refers to the fastening part position and attribute DB 51 and acquires the diameter of the bolt 5, and searches the dimension coefficient definition table relating to the bolt fastening based on the diameter. As a result, for example, if the diameter of the bolt 5 is less than 3 mm, then the equivalent property value replacement unit 49 acquires the value of 1 as a dimension coefficient.

Since the fastening portion 8 includes the two of the bolt fastening 3 and 4, the equivalent property value replacement unit 49 acquires the value of 2 as an argument $c_{13}$.

Relating to the rivet fastening, the dimension coefficient definition table in a similar format as shown in FIG. 11 is provided for the fastening part equivalent property value library 52.

FIG. 12 shows an example of a fillet weld coefficient definition table. In FIG. 12, the left column indicates a record number, the central column indicates the presence/absence of fillet weld, and the right column indicates a welding coefficient. The welding coefficient is used as an argument $c_{14}$.

The fillet weld can also be used with another method of fastening such as bolt fastening, rivet fastening, spot welding, etc., and can be used solely. The equivalent property value replacement unit 49 refers to the fastening part position and attribute DB 51, acquires the information about whether or not the fillet weld is used for the fastening portion corresponding to the geometry whose equivalent property value is to be calculated, and searches the fillet weld coefficient definition table according to the acquired information. As a result, if the fillet weld is used, the equivalent property value replacement unit 49 acquires the welding coefficient of 5. If it is not used, the equivalent property value replacement unit 49 acquires the welding coefficient of 1.

FIG. 13 is an explanatory view of an argument further required when the fillet weld is used. One is a welding length used as an argument $c_{15}$, and another is a contact edge length used as an argument $c_{16}$.

FIG. 13 is a top view showing the fastening of plates 71 and 72 as with the case shown in FIG. 9. In FIG. 13, the contact surface between the plates 71 and 72 is a portion enclosed by the bold dotted lines. The rectangular contact surface has the length "a" of the horizontal edge shown in FIG. 13, and the length "b" of the vertical edge. In FIG. 13, the fillet weld is performed from end to end along the two edges having the length a as indicated by the double lines.

In this example, the welding length is a+a=2a. Since the contact edge length is defined as the length of the perimeter of the contact surface, it is calculated by a+b+a+b=2 (a+b).

How many edges in the contact surface of a polygon having n angles are treated by fillet weld is arbitrarily determined normally. For example, in FIG. 2A, the fillet weld can be performed on the portion where the right end of the plate 1 contacts the top surface of the plate 2 and on the portion where the left end of the plate 2 contacts the bottom surface of the plate 1, thereby the fastening of the fastening portion 8 can be intensified. It is not necessary to perform the fillet weld from end to end of each edge. In another mode for embodying the present invention, the area of the contact surface can be used in calculating the equivalent property value, and a·b is used in the example above.

FIG. 14 shows an example of a material and property value correspondence table storing various property values depending on the material of the original part. The equivalent property value replacement unit 49 recognizes the material of a part with reference to the fastening part position and attribute DB 51, searches the material and property value correspondence table using the recognized material as a key, and acquires a target property value. For example, when the equivalent property value of the Young's modulus for the plate 11 shown in FIG. 2D is to be calculated, the Young's modulus $p_1$ is acquired based on the material of the plate 1.

Using the values acquired as described above, the equivalent property value replacement unit 49 calculates an equivalent property value. The calculation is performed by calling the function $f_1$ defined in the fastening part equivalent property value library 52.

For example, in a mode for embodying the present invention, the function $f_1$ of the equation (2-1) is practically expressed by the following equation (3-1) or (3-2). The geometry coefficient and the fillet weld coefficient used in the equations are defined by the equations (4-1), (4-2), (5-1), and (5-2). Which equations are to be combined depends on the fastening method. Therefore, it is described below for each case.

First, the presence/absence of fillet weld is not checked, and when a fastening portion includes bolt fastening or rivet fastening, the following equations are used.

$$Ye = Fs \cdot G \cdot Fw \cdot Yo \quad (3\text{-}1)$$

where
Ye: equivalent property value of Young's modulus
Fs: fastening coefficient
G: geometry coefficient
Fw: fillet weld coefficient
Yo: original Young's modulus $$G = D \cdot N1 \quad (4\text{-}1)$$

where
D: dimension coefficient
N1: number $$Fw = Lw/Lc \cdot W \quad (5\text{-}1)$$

where
Lw: welding length
Lc: contact edge length
W: welding coefficient
(when fillet weld is performed)

$$Fw = W \quad (5\text{-}2)$$

(when fillet weld is not performed)

The fastening coefficient Fs of the equation (3-1) is shown in FIG. 10, and the dimension coefficient D of the equation (4-1) is shown in FIG. 11, and the welding coefficient W of the equations (5-1) and (5-2) are shown in FIG. 12. The "number" N1 in the equation (4-1) is the argument $c_{13}$, and indicates the number of bolt fastening or rivet fastening included in the candidate area whose equivalent property value is to be calculated. For example, FIG. 2A shows one fastening portion 8 including two of bolt fastening 3 and 4, and an equivalent property value is calculated on the candidate area including the fastening portion 8. Therefore, the "number" N1 is 2. Similarly, in FIG. 7B, since the candidate area 63 includes the bolts 36 and 37, the "number" N1 is 2.

For example, assuming that the plate 1 shown un FIG. 2A is aluminum, the diameter of the bolt 5 is 3 mm or less, and the fillet weld is not performed, the equivalent property value of the Young's modulus of the plate 11 is:

$$0.3 \cdot (1 \cdot 2) \cdot 1 \cdot 71 [GPa].$$

Depending on the mode for embodying the present invention, there can be fastening by fillet weld only. In this case, the function expressed by the following equation (3-2) can be defined as a function $f_1$ in the fastening part equivalent property value library 52. In the equation (3-2), α is a constant, and the fillet weld coefficient Fw is defined by the equation (5-1).

$$Ye = \alpha \cdot Fw \cdot Yo \quad (3\text{-}2)$$

Depending on the mode for embodying the present invention, there can be fastening by spot welding only, and fastening by a combination of spot welding and fillet weld only. In this case, the function defined by the equation (3-1) with the geometry coefficient G being defined by the following equation (4-2) can be defined as a function $f_1$ in the fastening part equivalent property value library 52. Since the size of a welded spot is substantially constant, the geometry coefficient G is defined using a constant $\beta$ in the equation (4-2).

$$G = \beta \cdot N2 \quad (4\text{-}2)$$

where

N2: number of spot-welded points

Described above is a practical example of assigning an equivalent property value in step S106. As described above with reference to FIG. 2D, the restriction conditions with reference to the relationship between the geometries after the dividing process is set after assigning the equivalent property value. There are two types of restriction conditions. The first type of restriction conditions is a restriction condition of holding contact on the division surface without relative displacement between the geometries divided on the surface of a candidate area. The second type of restriction conditions is a restriction condition of holding contact on the contact surface, which is defined by the original fastening, without relative displacement between the geometries which are obtained by dividing two original parts fastened each other and are included inside the candidate area.

For example, in the example shown in FIGS. 8A and 8B, the first type of restriction condition is a restriction condition of holding contact between the columns 64 and 65 without displacement, holding contact between the columns 65 and 66 without displacement, and holding contact between the girders 67 and 68 without displacement. The second type of restriction condition is a restriction condition of holding contact between the column 65 and the girder 68 without displacement. These restriction conditions are set for the geometric model 50d.

Thus, the analysis model 53 is obtained as a result of performing a process in step S106 on the geometric model 50d. The analysis model 53 has a simplified geometry as compared with the geometric model 50, but has a three-dimensional geometry. In step S106, the analysis model generation apparatus 40 outputs the analysis model 53, and the process in FIG. 5 terminates.

The generation of the analysis model 53 with reference to FIGS. 5 and 6 has the following effects.

First, since the manual operations and determination of a user are almost not required, the generating time has been largely reduced. In an example of experiment using a certain geometric model, all processes are not automatically performed, but a user performs confirmation or selection. Even though such a user operation is performed, an analysis model can be generated in a time period shorter than that required in generating a shell model in a conventional method.

In addition, since the geometry of the analysis model 53 is simplified, the amount of computer resources required in an analysis is much smaller than in the case where the geometric model 50 is used as is in an analysis.

Therefore, an apparatus that can not be conventionally analyzed can be analyzed. That is, there conventionally has been an apparatus that cannot be analyzed because of too many manual operations required in generating an analysis model, a too long time period of analyzing a too complicated geometry of an analysis model, or enormous computer resources required from a too complicated geometry of an analysis model. For example, although an apparatuses including hundreds of fastening portions are commonly used, the apparatuses cannot be conventionally analyzed. Therefore, actual apparatuses have been produced and experimented. However, the present mode of the embodiment enables at least a part of the apparatuses to be analyzed in a practical time period.

Furthermore, the contents of the fastening part equivalent property value library 52 can be appropriately determined based on an experiment etc. in advance. Thus, an analysis model can be generated by any user regardless of the expertise or knowledge of the user, and variations in the analysis accuracy can be reduced.

Figure 15:
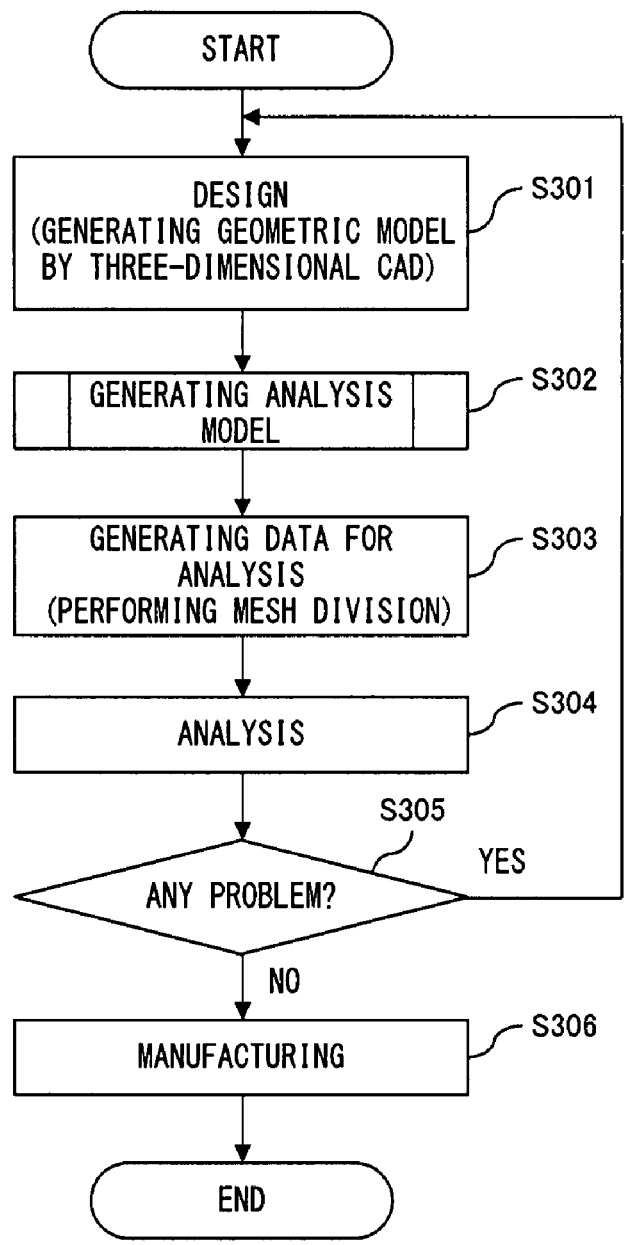
FIG. 15 is a flowchart of the producing step including the generation of an analysis model.

FIG. 15 is a flowchart of the manufacturing process including the generation of an analysis model according to a mode for embodying the present invention.

In step S301, a product is designed, and a detailed geometric model is generated in a three-dimensional CAD system.

Step S302 is performed after step S301. Step S302 corresponds to FIG. 5. That is, the geometric model generated in step S301 corresponds to the geometric model 50 shown in FIG. 4, it is applied as input to the analysis model generation apparatus 40 shown in FIG. 4, and the analysis model 53 is output.

Then, control is passed to step S303, and the data for an analysis is generated from the analysis model 53. For example, when a mechanical analysis is performed in a finite-element method, a mesh division is performed on the analysis model 53.

Then, control is passed to step S304, the analysis is performed based on the data generated in step S303. It is determined in step S305 as to whether or not there is a problem with a result of the analysis. For example, if it is certain after a mechanical analysis that the fastening portion of the product or other portions of the product do not satisfy the required specification in strength, the determination in step S305 is "YES" because the product does not satisfy the required specification. If it is determined that the product satisfies the required specification, then the determination in step S305 is "NO". When the determination is "YES", control is returned to step S301, and the designing is performed again. If the determination is "NO", control is passed to step S306.

In step S306, a product is manufactured based on the current geometric model. To be correct, in step S306, a practical apparatus is produced for an experiment, a strength test is performed on the practical apparatus, and the manufacture of a product for sale is started if there is no problem detected as a result of the strength test. If there is any problem, it is necessary to return to the designing process in step S301. In FIG. 15, the steps are omitted.

In FIG. 15, the processes in steps S301 through S304 are performed by a computer. The same computer can perform all steps S301 through S304, and separate computers can perform the respective steps.

FIGS. 16A, 16B, 17A, and 17B show examples of performing fastening in other methods. The above-described method of generating an analysis model can be applied to various fastening methods.

FIGS. 16A and 16B show an example of fastening plates 75 and 76 using two L-shaped metal fixtures. Any material can be used for the plates 75 and 76. FIGS. 16A and 16B show coordinate axes for convenience of reference. FIG. 16A is a perspective view, FIG. 16B is a sectional view by a plane expressed by x=A that is parallel to the yz plane.

In FIG. 16A, the plates 75 and 76 have rectangular surfaces. The plate 75 is set vertically and the direction of the thickness is the y-axis direction. The plate 76 is set horizontally, and the direction of the thickness is the z-axis direction. The plus side of the y axis is hereinafter referred to as "front" and the minus side of the y axis is hereinafter referred to as "back". Then, the backmost of the plate 76 contacts the plate 75. The plates 75 and 76 are equal in length in the x-axis direction, and fastened on both ends in the x-axis direction. In the following descriptions, both ends in the x-axis direction are hereinafter referred to as the leftmost end and the rightmost end.

To be more correct, the plates 75 and 76 are not directly fastened, but indirectly fastened through the L-shaped metal fixtures 77a and 77b. The L-shaped metal fixture 77a at the leftmost end contacts both plates 75 and 76. The plate 75 and the L-shaped metal fixture 77a are fastened using the bolt 78a. The plate 76 and the L-shaped metal fixture 77a are fastened using the bolt 79a. Similarly, the L-shaped metal fixture 77b at the rightmost end contacts both plates 75 and 76. The plate 75 and the L-shaped metal fixture 77b are fastened using the bolt 78b. The plate 76 and the L-shaped metal fixture 77b are fastened using the bolt 79b.

With respect to the structure, for example, four fastening portions corresponding to four bolts are extracted in step S102 shown in FIG. 5, and the four bolts shown in FIG. 16A and four nuts not shown in the attached drawings corresponding to the four bolts are deleted in step S103. Then, in step S104, holes corresponding to the four bolts are filled. That is, the holes in the plates 75 and 76 and the L-shaped metal fixtures 77a and 77b are filled. In the dividing process in step S105, for example, the division shown in FIG. 16B can be performed.

FIG. 16B is a sectional view of FIG. 16A by a plane expressed by "x=A" and crossing the L-shaped metal fixture 77a. In the sectional view, the plate 75 is divided into a plate 81 as a portion corresponding to the contact surface with the L-shaped metal fixture 77a and the contact surface with the plate 76, and a plate 80 as a portion above the L-shaped metal fixture 77a. The plate 76 is divided into a plate 83 as a portion corresponding to the contact surface with the L-shaped metal fixture 77a and a plate 82 as a portion in front of the plate 83. The L-shaped metal fixture 77a is not divided.

For example, in step S102, only a part of the plate 75 whose z coordinate ranges across the same range as the contact surface with the L-shaped metal fixture 77a may be extracted as a fastening portion, but the division result as shown in FIG. 16B is obtained by setting a candidate area larger than the fastening portion. Then, in step S106 shown in FIG. 5, an equivalent property value is assigned to the plates 81 and 83, and the L-shaped metal fixture 77a.

With respect to the fastening portion on the right, the dividing process is similarly performed and the equivalent property values are similarly assigned. When the length in the x-axis direction of the plates 75 and 76 is short, the candidate areas corresponding to the right and left fastening portions can be combined into one candidate area in step S203 shown in FIG. 6.

FIGS. 17A and 17B show an example of fastening pipes 91 and 92 using an external thread of the pipe 91 and an internal thread of the pipe 92. With the fastening above, the short two pipes 91 and 92 are incorporated into one long pipe. FIG. 17A is a sectional view of the external thread of the pipe 91 engaged with the internal thread of the pipe 92. FIG. 17B corresponds the analysis model 53 generated from the geometric model 50, and expressed as a sectional view in a manner similar to FIG. 17A.

For example, in a certain three-dimensional CAD system, the geometries of a ridge and a groove may not be represented. In this case, in the geometric model 50, the surface between the ridge and the groove can be represented as the surfaces of the pipes 91 and 92.

In this case, in step S102 shown in FIG. 5, the portion at which the external thread and the internal thread are engaged with each other is extracted as a fastening portion, and there is no object to be deleted or filled in steps S103 and S104. Therefore, no specific process is performed in steps S103 and S104. In step S105 corresponding to FIG. 6, the pipe 91 is divided into two geometries of pipes 93 and 94, and the pipe 92 is divided into two geometries of pipes 95 and 96. In step S106, an equivalent property value is assigned to each of the pipe 94 and the pipe 96, which correspond to the fastening portion. In FIG. 17B, the portion to which an equivalent property value is assigned is represented by diagonal lines. In this case, it is assumed that a method of calculating an equivalent property value is defined in the fastening part equivalent property value library 52 based on at least one of the number of ridges, pitch, lead, geometry, material, etc.

Otherwise, there can be a three-dimensional CAD system that represents the geometries of a ridge and a groove. In this case, instead of steps S103 and S104 shown in FIG. 5, the analysis model generation apparatus 40 can perform, for example, the process of setting the smooth surface between the ridge and the groove corresponding to the surface of the pipes 94 and 96 shown in FIG. 17B as the surfaces of the pipes 91 and 92 on the geometric model 50. As a result, the contact between the pipes 91 and 92 on the set surface is modeled. Afterwards, the analysis model 53 shown in FIG. 17B can be obtained by similarly performing the processes in steps S105 and S106.

Figure 18:
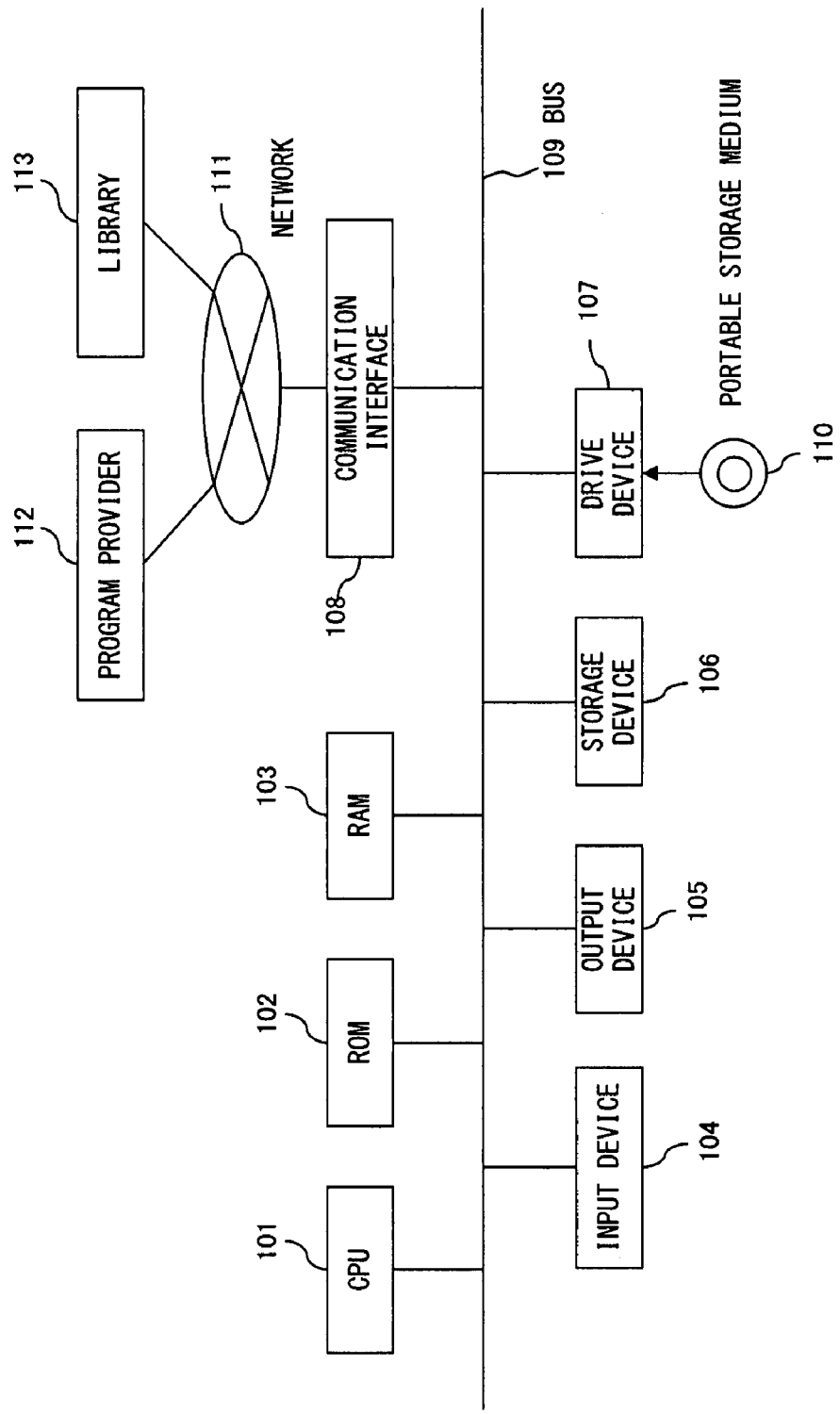
FIG. 18 is a block diagram of a computer for executing a program.

An analysis model can be generated according to the above-mentioned modes for embodying the present invention by a common computer as shown in FIG. 18. The computer shown in FIG. 18 corresponds to the analysis model generation apparatus 40 shown in FIG. 4. The processes in steps S301, S303, and S304 shown in FIG. 15 also can be performed by a similar computer.

The computer shown in FIG. 18 includes a CPU (central processing unit) 101, ROM (read only memory) 102, RAM (random access memory) 103, an input device 104, an output device 105, a storage device 106, a drive device 107 of a portable storage medium 110, and a communication interface 108, and these components are all connected via a bus 109.

The computer shown in FIG. 18 is connected to a network 111 through the communication interface 108. The network 111 can be an arbitrary network such as a LAN (local area network), the Internet, etc. The fastening part equivalent property value library 52 can be a library 113 connected over the network 111.

The input device 104 is a pointing device such as a mouse etc. and/or a keyboard. The output device 105 is a display device such as a liquid crystal display. The output device 105 can display the geometric model 50 and the analysis model 53 in accordance with an instruction from a user, allowing the user to visually confirm them.

The storage device 106 can be a magnetic disk device such as a hard disk drive. A storage device of other types can be adopted as the storage device 106.

The storage device 106 or the ROM 102 stores a program for realization of the operation described with reference to the modes for embodying the present invention. The CPU 101 executes the program, thereby the processes shown in FIGS. 5 and 6 are performed.

The storage device 106 can store the fastening part position and attribute DB 51 and/or the fastening part equivalent property value library 52. In this case, for example, the latest data is downloaded from the library 113 through the network 111 and the communication interface 108, and the contents of the storage device 106 can be updated.

The data of the geometric model 50 which has already been generated is stored in the storage device 106, and is read to the RAM 103 in step S101 shown in FIG. 5.

The program above can be provided from a program provider 112 through the network 111 and the communication interface 108, can be stored, for example, in the storage device 106, and can be executed by the CPU 101. The portable storage medium 110 can store the program, the portable storage medium 110 can be set in the drive device 107, and the stored program can be executed by the CPU 101 after the stored program is loaded into the RAM 103. The portable storage medium 110 can be various storage media in the format of an optical disk such as a CD (compact disc), a DVD (digital versatile disk), etc., a magneto optical disk, a flexible disk, etc.

In addition, the geometric model 50, the fastening part position and attribute DB 51, and the fastening part equivalent property value library 52 can be stored in the portable storage medium 110. The portable storage medium 110 can be set in the drive device 107, the data stored in the portable storage medium 110 can be copied to the storage device 106 and used in the processes shown in FIGS. 5 and 6.

The present invention is not limited to the above-mentioned modes for embodying the present invention, but can be varied. Some examples are described below.

In the flowchart shown in FIG. 5, processes are performed in an order such that all fastening portions are extracted in step S102, the parts to be deleted are all deleted in step S103, and then the holes to be filled are all filled in step S104. However, the processing order can be changed. For example, if one fastening portion is extracted, the part(s) is/are deleted and the hole(s) is/are filled relating to the fastening portion, and then the next fastening portion is extracted.

The processes by a user confirming and/or selecting steps can be added. For example, the process in step S102 can be modified such that a user can confirm whether or not the fastening portion(s) is/are correctly extracted. Otherwise, the fastening part equivalent property value library 52 can be configured such that the method of calculating an equivalent property value can be selected from a plurality of methods so that a user can select it in step S106. Otherwise, the process in step S202 can be modified such that a set of candidate areas that can be combined is presented to a user, and the user can be allowed to select whether or not the candidate areas should be combined.

On the other hand, depending on the mode for embodying the present invention, the processes in steps S103 and S104 can be omitted. For example, in a mode for embodying the present invention in an environment in which it is known in advance that all fastening portions are fastened by welding, the step S104 can be omitted. In this case, if it is known in advance that the geometric model 50 not reflecting a welding geometry is used, step S103 can also be omitted.

A practical method of calculating an equivalent property value can be varied depending on the mode for embodying the present invention. That is, practical contents of the fastening part equivalent property value library 52 can be varied depending on the mode for embodying the present invention.

For example, in the equations (3-1) through (5-2) above, only multiplications and divisions are used, but an equivalent property value can be calculated by an equation including additions, subtractions, and other calculations. That is, in the above-mentioned equations (2-1) through (2-m), the practical definition of the functions $f_1 \sim f_m$ can be arbitrary.

Depending on the practical definition of the functions $f_1 \sim f_m$, the data to be stored in the fastening part equivalent property value library 52 is determined. In a mode for embodying the present invention, only one part of the tables shown in FIGS. 10 through 12 may be required. In another mode for embodying the present invention, tables other than FIGS. 10 through 12 may be also required. In addition, for example, the dimension coefficient is defined in FIG. 11 based on the diameter of a bolt, but the dimension coefficient can be defined based on the combination of the diameter and length of the bolt. Similarly, in FIG. 10, a fastening coefficient can be defined based on the combination of the fastening type and the material of fastening parts. Furthermore, the data format in the fastening part equivalent property value library 52 is optional, and the data can be stored in the format other than the table format such as FIGS. 10 through 12, and 14. That is, if generalized descriptions are made, the fastening part equivalent property value library 52 defines the value of one or more parameters required in calculating an equivalent property value based on one or more items of the items such as the type, dimensions, geometry, material, etc. indicating the attribute of a fastening part that can be obtained from the fastening part position and attribute DB 51, and stores the value.

The values shown in FIGS. 10 through 12 are shown for convenience of explanation, and are not intended to indicate preferable values. It is desired that practical values stored in the fastening part equivalent property value library 52 are appropriately determined by an experiment etc. Furthermore, depending on the definitions of the functions $f_1 \sim f_m$, there are various preferable values. For example, there can be the case where a function $f_1$ for calculation of an equivalent property value $q_1$ of a Young's modulus and a function $f_2$ for calculation of an equivalent property value $q_2$ of a Poisson ratio have "fastening coefficients" as arguments. In this case, the fastening coefficient as an argument of the function $f_1$ and the fastening coefficient as an argument of the function $f_2$ can be defined in the same method, or can be defined separately on different tables.

In the above-mentioned modes for embodying the present invention, the functions $f_1 \sim f_m$ are defined on the fastening part equivalent property value library 52, and the equivalent property value replacement unit 49 calls these functions. However, the fastening part equivalent property value library 52 can hold only the data as shown in FIGS. 10 through 12, and 14, and the definition of the functions can be incorporated into the program for realization of the function of the equivalent property value replacement unit 49 according to a mode for embodying the present invention.

There can be various objects for which analysis models are to be generated in the above-mentioned operations, and there are also various methods used in fastening portions included in the objects and materials of the objects. For example, FIG. 14 shows only aluminum and steel as the material, but the method of generating an analysis model according to the above-mentioned modes for embodying the present invention can process various materials such as metal, wood, synthetic resin, natural resin, glass, etc.

For example, when an apparatus for which wood or synthetic resin is used as material, there can be fastening using an adhesive. In this case, the fastening part equivalent property value library 52 defines a method of calculating an equivalent property value based on at least one or more of the type of adhesive, material of a part to be adhered, ratio between the application area of the adhesive and the area of the contact surface, etc. In addition, in the case where wood is used as material for an apparatus, the fastening can be made using nails. In this case, the fastening part equivalent property value library 52 defines the method of calculating an equivalent property value based on at least one of the geometry, dimension, material, etc. of nail.

In addition, the above-mentioned modes for embodying the present invention can be applied to the fastening other than the examples shown above such as fastening using pins, wedges, etc. Furthermore, the apparatus to which the modes for embodying the present invention are applied can be various devices such as electronic equipment, machine, tool, vehicle, various housings (namely, various chassis), furniture, buildings, etc.

In the example above, the process of combining candidate areas as shown in FIG. 6 is performed, but the combination of candidate areas is not essential. In addition, the geometry of a candidate area is described with reference to the case where a rectangular parallelepiped is used for a simpler process in steps S203 and S204, but any geometry can be used for a candidate area.

What is claimed is:

1. A non-transitory computer-readable storage medium storing an analysis model generation program used to direct a computer to generate an analysis model by processing a three-dimensional geometric model of an apparatus including a plurality of parts, by performing a method comprising:
   receiving the three-dimensional geometric model as input, and storing the three-dimensional geometric model in a first storage unit;
   referring to a second storage unit storing attribute information about fastening between the parts, and extracting a fastening portion at which a first part and a second part are fastened based on the attribute information and the three-dimensional geometric model;
   dividing each of the first part and the second part into a first geometry in proximity of the fastening portion and one or more second geometries corresponding to a remaining portion of the first geometry in the three-dimensional geometric model; and
   referring, with respect to each of the first geometry obtained by dividing the first part and the first geometry obtained by dividing the second part, to a third storage unit storing a parameter depending on the attribute information and a property value depending on a material of the part, calculating an equivalent property value as a property value reflecting fastening based on the parameter and the property value stored in the third storage unit, and assigning the equivalent property value to the first geometry, wherein the first geometry is assigned the property value different from the property value of the first part before the dividing.

2. The storage medium according to claim 1, wherein the method that the analysis model generation program directs the computer to perform further comprises deleting a third part from the three-dimensional geometric model when the fastening portion includes the third part for fastening the first part to the second part.

3. The storage medium according to claim 2, wherein the method that the analysis model generation program directs the computer to perform further comprises performing a filling operation on a hole in the three-dimensional geometric model when at least one of the first part and the second part has a hole, and the first part and the second part are fastened by engaging the third part in the hole.

4. The storage medium according to claim 2, wherein the third part is any of a bolt, a rivet, a nail, a pin, spot welding, and fillet weld.

5. The storage medium according to claim 2, wherein when the fastening portion includes the third part, and when the fastening portion further includes a fourth part used with the third part for fastening, the analysis model generation program further directs the computer to delete the fourth part from the three-dimensional geometric model in the deleting.

6. The storage medium according to claim 5, wherein the fourth part is a nut or a washer.

7. The storage medium according to claim 2, wherein the attribute information relating to fastening using the third part includes at least one of the type, material, dimension, geometry of the third part, and the number of the third parts corresponding to one fastening portion.

8. The storage medium according to claim 7, wherein the type of the third part includes at least one of a bolt, a rivet, a nail, a pin, spot welding, fillet weld, an adhesive, and a screw.

9. The storage medium according to claim 1, wherein when the first part and the second part is fastened by fillet weld, the equivalent property value is calculated using at least one of a length of the fillet weld, an area of a contact surface on which the first part and the second part contact by the fillet weld, and a perimeter of the contact surface.

10. The storage medium according to claim 1, wherein the method that the analysis model generation program directs the computer to perform further comprises:
    setting a first restriction condition of holding contact between the first geometry and the second geometry without relative displacement on a division surface on which the first and second geometries are divided; and
    setting a second restriction condition of holding contact on respective surfaces between the first geometry obtained by dividing the first part and the first geometry obtained by dividing the second part without relative displacement on the surfaces.

11. The storage medium according to claim 1, wherein the property value includes at least one type of a Young's modulus, a Poisson ratio, a mass density, a thermal expansion coefficient, and a vibration damping factor.

12. The storage medium according to claim 1, wherein when dividing, a division surface, on which the first geometry and the second geometry are divided, is a plane.

13. The storage medium according to claim 12, wherein when there are a plurality of second geometries corresponding to one part, or there are a plurality of parts to be divided during dividing, a relationship between all division surfaces is parallel or orthogonal.

14. The storage medium according to claim 1, wherein the dividing comprises:
    a candidate area setting comprising setting a candidate area as a candidate for a three-dimensional area having a surface for determination of a division surface for division into the first geometry and the second geometry corresponding to the fastening portion;
    a candidate area combining comprising setting one new candidate area including a plurality of candidate areas by combining the plurality of candidate areas when the plurality of candidate areas satisfy both of a condition that there is a set of candidate areas close to each other and a condition that the set of the candidate areas can be combined; and
    a division executing comprising determining a surface of the candidate area crossing the part as a division surface between the first geometry and the second geometry, and making a division by the division surface.

15. The storage medium according to claim 14, wherein:
    all the candidate areas are rectangular parallelepiped space; and all edges of the rectangular parallelepiped are parallel to either of an x axis, a y axis, and a z axis as coordinate axes predetermined corresponding to the three-dimensional geometric model.

16. The storage medium according to claim 14, wherein the condition in the candidate area combining is determined based on at least one of a distance between the plurality of candidate areas and the number of parts commonly included in the plurality of candidate areas.

17. An analysis model generation apparatus which generates an analysis model by processing a three-dimensional geometric model of an apparatus including a plurality of parts, comprising:
- a reception unit receiving the three-dimensional geometric model as input, and storing the three-dimensional geometric model in a first storage unit;
- a fastening portion extraction unit referring to a second storage unit storing attribute information about fastening between the parts, and extracting a fastening portion at which a first part and a second part are fastened based on the attribute information and the three-dimensional geometric model;
- a dividing unit dividing each of the first part and the second part into a first geometry in proximity of the fastening portion and one or more second geometries corresponding to a remaining portion of the first geometry in the three-dimensional geometric model; and
- an equivalent property value assignment unit operating with respect to each of the first geometry obtained by dividing the first part and the first geometry obtained by dividing the second part, wherein the operating includes referring to a third storage unit storing a parameter depending on the attribute information and a property value depending on a material of the part, calculating an equivalent property value as a property value reflecting fastening based on the parameter and the property value stored in the third storage unit, and assigning the equivalent property value to the first geometry, wherein the first geometry is assigned the property value different from the property value of the first part before the dividing.

18. An analysis model generating method performed by a computer, for generating an analysis model by processing a three-dimensional geometric model of an apparatus including a plurality of parts, comprising:
- receiving the three-dimensional geometric model as input and storing the three-dimensional geometric model in a first storage unit, by the computer;
- referring to a second storage unit storing attribute information about fastening between the parts and extracting a fastening portion at which a first part and a second part are fastened based on the attribute information and the three-dimensional geometric model, by the computer;
- dividing each of the first part and the second part into a first geometry in proximity of the fastening portion and one or more second geometries corresponding to a remaining portion of the first geometry in the three-dimensional geometric model, by the computer; and
- with respect to each of the first geometry obtained by dividing the first part and the first geometry obtained by dividing the second part,
- referring, by the computer, to a third storage unit storing a parameter depending on the attribute information and a property value depending on a material of the part,
- calculating, by the computer, an equivalent property value as a property value reflecting fastening based on the parameter and the property value stored in the third storage unit, and
- assigning the equivalent property value to the first geometry, by the computer, wherein the first geometry is assigned the property value different from the property value of the first part before the dividing.

* * * * *